(12) United States Patent
Cohen et al.

(10) Patent No.: US 9,919,472 B1
(45) Date of Patent: Mar. 20, 2018

(54) STACKING AND BONDING METHODS FOR FORMING MULTI-LAYER, THREE-DIMENSIONAL, MILLIMETER SCALE AND MICROSCALE STRUCTURES

(71) Applicant: Microfabrica Inc., Van Nuys, CA (US)

(72) Inventors: Adam L. Cohen, Dallas, TX (US); Michael S. Lockard, Lake Elizabeth, CA (US); Rulon J. Larsen, III, Reseda, CA (US); Uri Frodis, Los Angeles, CA (US); Kieun Kim, Pasadena, CA (US); Dennis R. Smalley, Newhall, CA (US)

(73) Assignee: Microfabrica Inc., Van Nuys, CA (US)

( * ) Notice: Subject to any disclaimer, the term of this patent is extended or adjusted under 35 U.S.C. 154(b) by 979 days.

(21) Appl. No.: 14/280,517

(22) Filed: May 16, 2014

Related U.S. Application Data

(63) Continuation-in-part of application No. 14/156,437, filed on Jan. 15, 2014, now Pat. No. 9,533,376, and a continuation-in-part of application No. 14/194,214, filed on Feb. 28, 2014, now Pat. No. 9,597,834, said application No. 14/194,214 is a continuation of
(Continued)

(51) Int. Cl.
*B23K 20/00* (2006.01)
*B29C 65/48* (2006.01)

(52) U.S. Cl.
CPC .............. *B29C 65/48* (2013.01); *B23K 20/00* (2013.01)

(58) Field of Classification Search
CPC ...................................................... B29C 65/48
See application file for complete search history.

(56) References Cited

U.S. PATENT DOCUMENTS

| 4,752,352 A | 6/1988 | Feygin |
| 5,015,312 A | 5/1991 | Kinzie |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.
(Continued)

*Primary Examiner* — Kiley Stoner
(74) *Attorney, Agent, or Firm* — Dennis R. Smalley

(57) ABSTRACT

Embodiments are directed to methods of producing devices using modified multi-layer, multi-material electrochemical fabrication processes and/or using a laser cutting processes wherein individual layers or layer groups are formed and then stacked and bonded to produce prototypes or production parts. The methods can reduce the cost and lead time of prototyping when compared with previous multi-layer, multi-material electrochemical fabrication processes and can also reduce the lead time of production quantities, by allowing multiple layers of a multilayer device to be formed simultaneously, e.g. in parallel on the same wafer. Additionally, these methods may be used to extend the maximum height to which parts may practically be made. Finally, the methods allow geometries that are impossible, impractical or difficult to release (e.g. microfluidic devices such as pumps or parts with long, narrow channels) to be fabricated in multiple pieces and then joined after full or partial release.

20 Claims, 30 Drawing Sheets

Related U.S. Application Data application No. 13/287,437, filed on Nov. 2, 2011, now Pat. No. 8,702,955, which is a continuation of application No. 12/345,624, filed on Dec. 29, 2008, now Pat. No. 8,070,931, and a continuation-in-part of application No. 11/506,586, filed on Aug. 18, 2006, now Pat. No. 7,611,616, and a continuation-in-part of application No. 11/435,809, filed on May 16, 2006, now abandoned, and a continuation-in-part of application No. 10/677,556, filed on Oct. 1, 2003, now abandoned, and a continuation-in-part of application No. 10/434,103, filed on May 7, 2003, now Pat. No. 7,160,429.

(60) Provisional application No. 61/824,334, filed on May 16, 2013, provisional application No. 61/752,596, filed on Jan. 15, 2013, provisional application No. 61/807,816, filed on Apr. 3, 2013, provisional application No. 61/888,060, filed on Oct. 8, 2013, provisional application No. 61/018,229, filed on Dec. 31, 2007, provisional application No. 60/709,614, filed on Aug. 19, 2005, provisional application No. 60/681,788, filed on May 16, 2005, provisional application No. 60/379,182, filed on May 7, 2002, provisional application No. 60/430,809, filed on Dec. 3, 2002, provisional application No. 60/415,374, filed on Oct. 1, 2002.

(56) References Cited

U.S. PATENT DOCUMENTS

| | | | |
|---|---|---|---|
| 5,190,637 A | 3/1993 | Guckel | |
| 5,349,743 A * | 9/1994 | Grader | H01F 17/0033 156/89.12 |
| 5,730,817 A | 3/1998 | Feygin et al. | |
| 5,876,550 A | 3/1999 | Feygin et al. | |
| 6,027,630 A | 2/2000 | Cohen | |
| 6,790,377 B1 | 9/2004 | Cohen | |
| 6,802,927 B2 * | 10/2004 | Biegelsen | B23K 26/0661 156/247 |
| 7,109,118 B2 | 9/2006 | Cohen et al. | |
| 7,160,429 B2 | 1/2007 | Cohen et al. | |
| 7,195,989 B2 | 3/2007 | Lockard et al. | |
| 7,198,704 B2 | 4/2007 | Cohen et al. | |
| 7,229,542 B2 | 6/2007 | Bang | |
| 7,235,166 B2 | 6/2007 | Cohen et al. | |
| 7,239,219 B2 | 7/2007 | Brown et al. | |
| 7,250,101 B2 | 7/2007 | Thompson et al. | |
| 7,252,861 B2 | 8/2007 | Smalley | |
| 7,260,890 B2 * | 8/2007 | White | H01F 41/041 228/180.1 |
| 7,288,178 B2 | 10/2007 | Cohen et al. | |
| 7,291,254 B2 | 11/2007 | Cohen et al. | |
| 7,368,044 B2 | 5/2008 | Cohen et al. | |
| 7,412,767 B2 * | 8/2008 | Kim | G01R 1/0483 228/180.5 |
| 7,498,714 B2 | 3/2009 | Lockard et al. | |
| 7,501,328 B2 * | 3/2009 | Lockard | B81C 1/00492 438/466 |
| 7,611,616 B2 | 11/2009 | Cohen et al. | |
| 7,686,770 B2 | 3/2010 | Cohen | |
| 8,070,931 B1 | 12/2011 | Cohen et al. | |
| 8,246,917 B2 * | 8/2012 | Gracias | A61K 9/0097 422/547 |
| 8,592,732 B2 * | 11/2013 | Lee | H05B 3/145 219/548 |
| 2003/0221968 A1 | 12/2003 | Cohen et al. | |
| 2004/0000489 A1 | 1/2004 | Zhang et al. | |
| 2004/0004001 A1 | 1/2004 | Cohen et al. | |
| 2004/0065550 A1 | 4/2004 | Zhang | |
| 2004/0065555 A1 | 4/2004 | Zhang | |
| 2004/0134772 A1 | 7/2004 | Cohen et al. | |
| 2004/0146650 A1 | 7/2004 | Lockard et al. | |
| 2005/0023145 A1 | 2/2005 | Cohen et al. | |
| 2005/0029109 A1 | 2/2005 | Zhang et al. | |
| 2005/0067292 A1 | 3/2005 | Thompson et al. | |
| 2005/0072681 A1 | 4/2005 | Cohen et al. | |
| 2005/0142739 A1 | 6/2005 | Kumar et al. | |
| 2005/0230261 A1 | 10/2005 | Cohen et al. | |
| 2006/0108678 A1 * | 5/2006 | Kumar | B23K 35/0222 257/690 |
| 2006/0282065 A1 | 12/2006 | Cohen | |
| 2007/0039828 A1 | 2/2007 | Cohen et al. | |
| 2007/0045121 A1 | 3/2007 | Cohen et al. | |
| 2007/0158200 A1 | 7/2007 | Cohen et al. | |
| 2007/0198038 A1 | 8/2007 | Cohen et al. | |
| 2007/0219459 A1 | 9/2007 | Cohen | |
| 2007/0265648 A1 | 11/2007 | Cohen | |
| 2008/0050524 A1 | 2/2008 | Kumar et al. | |
| 2008/0105355 A1 * | 5/2008 | Kumar | G01R 3/00 156/60 |
| 2008/0176046 A1 * | 7/2008 | Yamaguchi | B81C 3/008 428/195.1 |
| 2008/0220216 A1 * | 9/2008 | Unger | B01L 3/502707 428/172 |
| 2009/0065142 A1 * | 3/2009 | Zhang | C25D 5/022 156/308.2 |
| 2009/0212009 A1 * | 8/2009 | Lockard | B81C 1/00492 216/33 |
| 2009/0320990 A1 * | 12/2009 | Cohen | G01R 1/06716 156/150 |
| 2010/0187105 A1 * | 7/2010 | Unger | B01L 3/502707 204/400 |
| 2010/0327211 A1 * | 12/2010 | Fernandez Ledesma | B81C 3/001 251/368 |
| 2012/0061009 A1 * | 3/2012 | Chen | G01R 1/0483 156/150 |
| 2012/0189863 A1 * | 7/2012 | Houck | B81B 3/0059 428/596 |
| 2015/0243829 A1 * | 8/2015 | Slafer | H01L 27/142 438/73 |

OTHER PUBLICATIONS

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

"Microfabrication—Rapid Prototyping's Killer Application", Rapid Prototyping Report, CAD/CAM Publishing, Inc., Jun. 1999, pp. 1-5.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

* cited by examiner

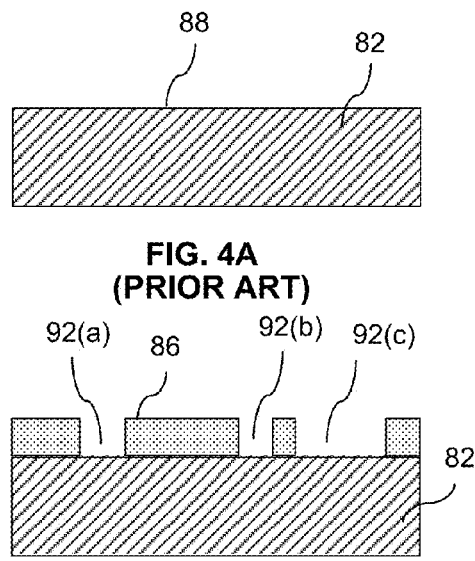
FIG. 4A (PRIOR ART)
FIG. 4B (PRIOR ART)
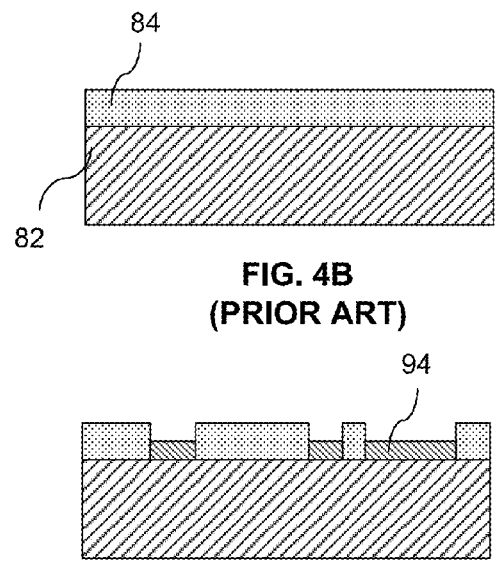
FIG. 4C (PRIOR ART)
FIG. 4D (PRIOR ART)
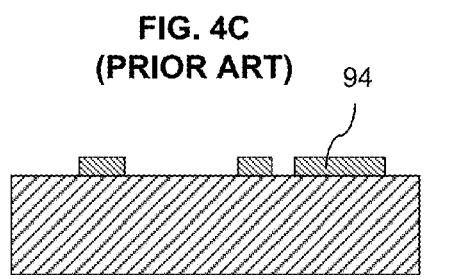
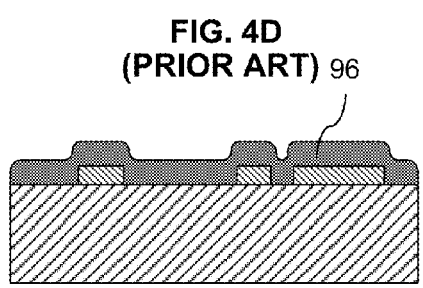
FIG. 4E (PRIOR ART)
FIG. 4F (PRIOR ART)
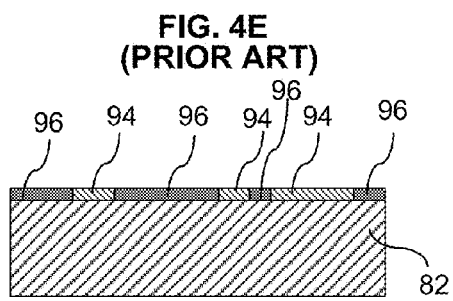
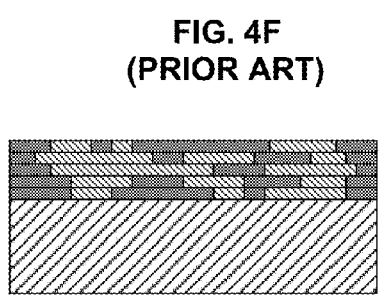
FIG. 4G (PRIOR ART)
FIG. 4H (PRIOR ART)
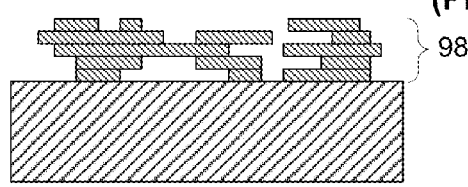
FIG. 4I (PRIOR ART)

FIG. 8A
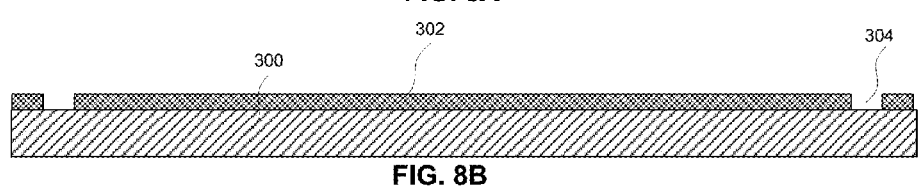
FIG. 8B
FIG. 8C
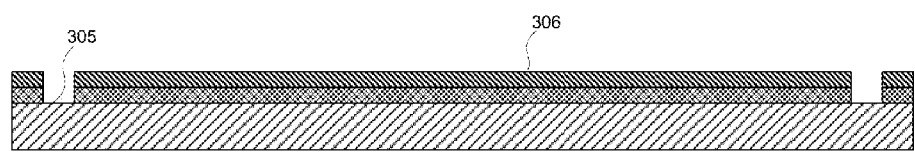
FIG. 8D
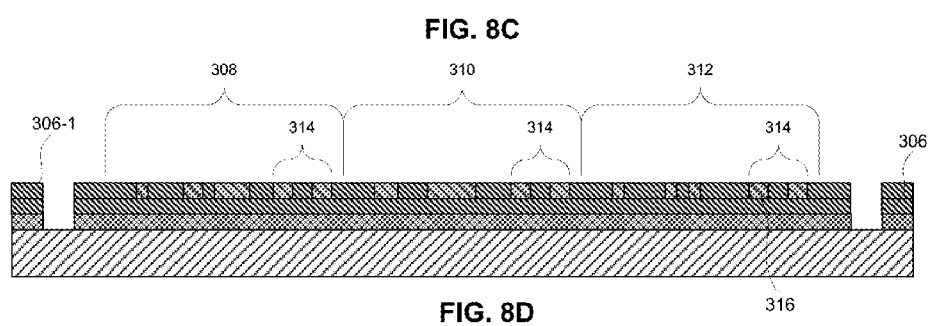
FIG. 8E
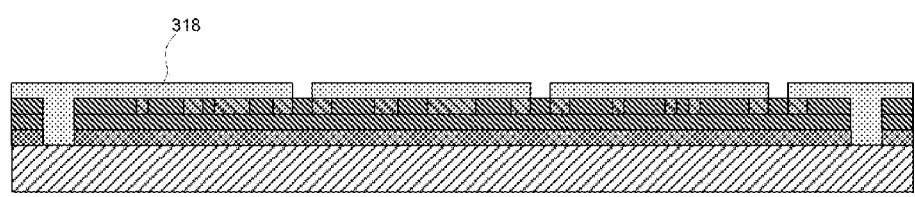
FIG. 8F
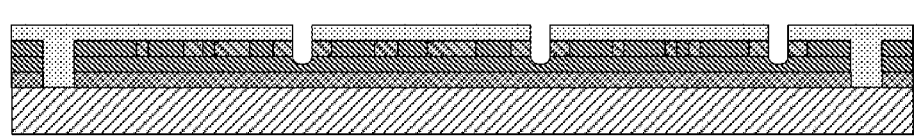

US 9,919,472 B1

STACKING AND BONDING METHODS FOR FORMING MULTI-LAYER, THREE-DIMENSIONAL, MILLIMETER SCALE AND MICROSCALE STRUCTURES

RELATED APPLICATIONS

The below table sets forth the priority claims for the instant application along with filing dates, patent numbers, and issue dates as appropriate. Each of these applications is incorporated herein by reference as if set forth in full herein.

| App. No. | Continuity Type | App. No. | Which was Filed (YYYY-MM-DD) | Which is now | Pat. No. |
| --- | --- | --- | --- | --- | --- |
| This application | claims benefit of | 61/824,334 | 2013-05-16 | pending | |
| This application | is a CIP of | 14/156,437 | 2014-01-15 | pending | |
| This application | is a CIP of | 14/194,214 | 2014-02-28 | pending | |
| 14/156,437 | claims benefit of | 61/752,596 | 2013-01-15 | lapsed | |
| 14/156,437 | claims benefit of | 61/807,816 | 2013-04-03 | lapsed | |
| 14/156,437 | claims benefit of | 61/888,060 | 2013-10-08 | pending | |
| 14/194,214 | is a CNT of | 13/287,437 | 2011-11-02 | issued | 8,702,955 |
| 13/287,437 | is a CNT of | 12/345,624 | 2008-12-29 | issued | 8,070,931 |
| 12/345,624 | claims benefit of | 61/018,229 | 2007-12-31 | lapsed | |
| 12/345,624 | is a CIP of | 11/506,586 | 2006-08-18 | issued | 7,611,616 |
| 11/506,586 | claims benefit of | 60/709,614 | 2005-08-19 | lapsed | |
| 11/506,586 | is a CIP of | 11/435,809 | 2006-05-16 | lapsed | |
| 11/506,586 | is a CIP of | 10/677,556 | 2003-10-01 | lapsed | |
| 11/435,809 | claims benefit of | 60/681,788 | 2005-05-16 | lapsed | |
| 11/435,809 | is a CIP of | 10/434,103 | 2003-05-07 | issued | 7,160,429 |
| 10/434,103 | claims benefit of | 60/379,182 | 2002-05-07 | lapsed | |
| 10/434,103 | claims benefit of | 60/430,809 | 2002-12-02 | lapsed | |
| 10/677,556 | claims benefit of | 60/415,374 | 2002-10-01 | lapsed | |

FIELD OF THE INVENTION

The present invention relates generally to the field of multi-layer, millimeter scale or micro-scale, non-integrated circuit device, structure, or component (hereafter "part") formation in a batch process wherein individual layers or groups of layers are formed and laterally patterned with a plurality of part cross-sections and then bonded together to form multi-layer or enhanced multi-layer parts. In some embodiments stacking occurs with intra-layer sacrificial material remaining in place and with a plurality of parts existing on each layer or groups of layers that are being bonded. In some embodiments layer formation, or layer group formation, occurs via electrochemical fabrication of one or more multi-material layers and/or via laser cutting part cross-sections from layers of sheet or film material and then stacking and bonding two or more such layers or layer groups together to build up parts.

BACKGROUND OF THE INVENTION

Electrochemical Fabrication:

An electrochemical fabrication technique for forming three-dimensional structures from a plurality of adhered layers is being commercially pursued by Microfabrica® Inc. (formerly MEMGen Corporation) of Van Nuys, California under the name MICA FREEFORM® (formerly EFAB™).

Various electrochemical fabrication techniques were described in U.S. Pat. No. 6,027,630, issued on Feb. 22, 2000 to Adam Cohen. Some embodiments of this electrochemical fabrication technique allow the selective deposition of a material using a mask that includes a patterned conformable material on a support structure that is independent of the substrate onto which plating will occur. When desiring to perform an electrodeposition using the mask, the conformable portion of the mask is brought into contact with a substrate, but not adhered or bonded to the substrate, while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single selective deposits of material or may be used in a process to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.

(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.

(3) A. Cohen, "3-D Micromachining by Electrochemical Fabrication", Micromachine Devices, March 1999.

(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.

(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.

(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.

(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.

(8) A. Cohen, "Electrochemical Fabrication (EFAB™)", Chapter 19 of The MEMS Handbook, edited by Mohamed Gad-El-Hak, CRC Press, 2002.

(9) Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

An electrochemical deposition for forming multilayer structures may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate. Typically this material is either a structural material or a sacrificial material.
2. Then, blanket depositing at least one additional material by electrodeposition so that the additional deposit covers both the regions that were previously selectively deposited onto, and the regions of the substrate that did not receive any previously applied selective depositions. Typically this material is the other of a structural material or a sacrificial material.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to an immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed. The removed material is a sacrificial material while the material that forms part of the desired structure is a structural material.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated (the pattern of conformable material is complementary to the pattern of material to be deposited). At least one CC mask is used for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for multiple CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of (1) the substrate, (2) a previously formed layer, or (3) a previously deposited portion of a layer on which deposition is to occur. The pressing together of the CC mask and relevant substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6, separated from mask 8, onto which material will be deposited during the process of forming a layer. CC mask plating selectively deposits material 22 onto substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C.

The CC mask plating process is distinct from a "through-mask" plating process in that in a through-mask plating process the separation of the masking material from the substrate would occur destructively. Furthermore in a through mask plating process, opening in the masking material are typically formed while the masking material is in contact with and adhered to the substrate. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the substrate on which plating is to occur (e.g. separate from a three-dimensional (3D) structure that is being formed). CC masks may be formed in a variety of ways, for example, using a photolithographic process. All masks can be generated simultaneously, e.g. prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

The '630 patent additionally teaches that the electroplating methods disclosed therein can be used to manufacture elements having complex microstructure and close tolerances between parts. An example is given with the aid of FIGS. 14A-14E of that patent. In the example, elements having parts that fit with close tolerances, e.g., having gaps between about 1-5 um, including electroplating the parts of the device in an unassembled, preferably pre-aligned, state and once fabricated. In such embodiments, the individual parts can be moved into operational relation with each other or they can simply fall together. Once together the separate parts may be retained by clips or the like.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing through mask exposures. A first layer of a primary metal is electroplated onto an exposed plating base to fill a void in a photoresist (the photoresist forming a through mask having a desired pattern of openings), the photoresist is then removed and a secondary metal is electroplated over the first layer and over the plating base. The exposed surface of the secondary metal is then machined down to a height which exposes the first metal to produce a flat uniform surface extending across both the primary and secondary metals. Formation of a second layer may then begin by applying a photoresist over the first layer and patterning it (i.e. to form a second through mask) and then repeating the process that was used to produce the first layer to produce a second layer of desired configuration. The process is repeated until the entire structure is formed and the secondary metal is removed by etching. The photoresist is formed over the plating base or previous layer by casting and patterning of the photoresist (i.e. voids formed in the photoresist) are formed by exposure of the photoresist through a patterned mask via X-rays or UV radiation and development of the exposed or unexposed areas.

The '637 patent teaches the locating of a plating base onto a substrate in preparation for electroplating materials onto the substrate. The plating base is indicated as typically involving the use of a sputtered film of an adhesive metal, such as chromium or titanium, and then a sputtered film of the metal that is to be plated. It is also taught that the plating base may be applied over an initial layer of sacrificial material (i.e. a layer or coating of a single material) on the substrate so that the structure and substrate may be detached if desired. In such cases after formation of the structure the sacrificial material forming part of each layer of the structure may be removed along the initial sacrificial layer to free the structure. Substrate materials mentioned in the '637 patent include silicon, glass, metals, and silicon with protected semiconductor devices. A specific example of a plating base includes about 150 angstroms of titanium and about 300 angstroms of nickel, both of which are sputtered at a temperature of 160° C. In another example it is indicated that the plating base may consist of 150 angstroms of titanium and 150 angstroms of nickel where both are applied by sputtering.

A need exists in various fields for miniature devices having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide an improved method for forming millimeter-scale or micro-scale, multi-layer three-dimensional structures.

It is an object of some embodiments of the invention to provide a method for forming multi-layer, millimeter-scale or micro-scale three-dimensional structures in less time.

It is an object of some embodiments of the invention to provide a method for forming multi-layer, millimeter-scale or micro-scale three-dimensional structures from a large palette of materials.

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein. It is not necessarily intended that all objects be addressed by any single aspect of the invention even though that may be the case with regard to some aspects.

A first aspect of the invention provides a method for forming at least a portion of a multi-layer three-dimensional part having a desired configuration, including: (a) forming at least first and second portions of a structure where each is formed from at least one multi-material layer including at least one structural material and at least one sacrificial material, where the first portion has a first surface and the second portion has a second surface where the first and second surfaces are separated from one another during formation of the layers but which are to be located in contact, or in proximity, to one another in the desired configuration; (b) separating the at least first and second portions of the structure from any sacrificial material that would hinder the bringing of the at least first and second portions into contact, or into proximity, or which would be effectively trapped if in place when the at least first and second portions are brought together; and (c) moving at least one of the at least first and second portions relative to the other to bring the at least first and second surfaces into contact or into proximity to a multi-portion stack of layers of the multi-layer three-dimensional part, wherein the forming comprises depositing at least one of the at least one structural material or the at least one sacrificial material selectively onto a substrate or previously deposited material via one or more openings in a masking material that is adhered to the substrate or previously deposited material, and wherein after bringing at least two of the least first and second portions into contact or into proximity, bonding at least the first and second portions together using a method selected from the group consisting of: (1) inclusion of an adhesion material on at least one of the first and second surfaces and then pressing the surfaces together to cause bonding; (2) inclusion of an adhesion material on at least one of the first and second surfaces and then pressing and heating the surfaces to cause bonding; (3) laser welding along at least portions of the perimeter of the intersecting portions of successive layers; (4) laser welding along internal regions of the structural material forming successive portions; (5) ultrasonic welding of successive portions on a layer-by-layer basis; (6) ultrasonic welding of successive portions after stacking of all portions; (7) riveting of successive portions using rivets inserted into both portions after stacking; (8) riveting of success portions using rivets formed along with at least one of the portion and which are made to extend into the other portion upon stacking; and (9) forming of holes in one or more portions and depositing material into the holes to cause bonding of the portions.

Numerous variations of the first aspect of the invention exist and include for example: (1) the at least first and second portions include at least first, second, and third portions; (2) the first and second portions are formed on the same substrate in the same fabrication process; (3) the first and second portions are formed on different substrates; (4) the at least one structural material or the at least one sacrificial material forming a multi-material layer of the first or second portion is formed by electrodeposition; (5) the at least one structural material or the at least one sacrificial material forming a multi-material layer of the first or second portion is formed by a selective electrodeposition into at least one opening in a dielectric masking material; (6) the at least one structural material on the first or second portion is formed from a sheet material; (7) the at least one structural material on the first or second portion is formed from a sheet material that is patterned by laser cutting; (8) formation of a multi-material layer results in formation of at least parts of multiple portions of the three-dimensional structure; (9) formation of a multi-material layer results in formation of at least parts of multiple portions of the three-dimensional structure with each portion representing one or more different layers of the same multi-layer part to be formed; (10) alignment of stacked layers use at least one alignment pin; (11) alignment of stacked layers use at least a plurality of alignment pins; (12) alignment of stacked layers use at least one alignment pin and an insertion location for the at least one alignment pin includes an opening in at least one structural material region of the at least two portions of a part being formed; (13) alignment of stacked layers use at least one temporary alignment pin that is removed prior to putting the part into service; (14) alignment of stacked layers use at least one permanent alignment pin that remains with the part as the part is put into service; (15) alignment of stacked layers use at least one alignment pin and an insertion location for the at least one alignment pin includes an opening in at least one sacrificial material region of the at least two portions of a part being formed; and (16) alignment of stacked layers includes use of at least one edge surface of a die or die group.

Numerous variations of the first variation of the first aspect of the invention exist and include for example: (1) the first and second portions are stacked and bonded prior to adding the third portion to the stack and bonding and (2) the first, second and third portions are stacked prior to bonding any of them and thereafter bonding of the first to the second and the second to the third occurs.

Numerous variations of the ninth variation of the first aspect of the invention exist and include for example: (1) at least a plurality of the multiple part layers represent different layers of different multi-layer parts that are to be formed; (2) at least a plurality of the multiple part layers represent different layers of different multi-layer parts that are to be formed wherein the different multi-layer parts are identical; (3) at least a plurality of the multiple part layers represent different layers of different multi-layer parts that are to be formed wherein the different multi-layer parts comprises a plurality of parts having different structural configurations.

Numerous variations of the sixteenth variation of the first aspect of the invention exist and include for example: (1) alignment of stacked layers includes use of at least one edge surface of a die or die group; (2) the at least one edge surface includes a structural feature of at least one portion; and (3) the at least one edge surface includes at least one non-part feature that is formed of structural material.

A second aspect of the invention provides a method for forming at least a portion of a three-dimensional structure having a desired configuration, including: (a) forming at least first and second portions of a structure from a plurality of adhered layers of at least one structural material where the first portion has a first surface and the second portion has a second surface where the first and second surfaces are separated from one another during formation of the layers but which are to be located in contact or in proximity to one another in the desired configuration; (b) moving at least one of the first and second portions relative to the other to bring the first and second surfaces into contact or into proximity, wherein the forming comprises depositing at least one of the at least one structural material onto a substrate or previously deposited material via one or more openings in a material that is adhered to the substrate or previously deposited material.

A third aspect of the invention provides a method for forming at least a portion of a three-dimensional structure having a desired configuration, including: (a) forming at least first and second portions of a structure from a plurality of adhered layers of at least one structural material where the first portion has a first surface and the second portion has a second surface where the first and second surfaces are separated from one another during formation of the layers but which are to be located in contact or in proximity to one another in the desired configuration; and (b) moving at least one of the first and second portions relative to the other to bring the first and second surfaces into contact or into proximity, (i) wherein the forming comprises depositing at least one material selectively onto a substrate or previously deposited material via one or more openings in a masking material that is adhered to the substrate or previously deposited material, and (ii) wherein the forming comprises forming one or more alignment structures which aid in locating the first and second surfaces in proximity or in contact and/or which aid in guiding the first and second surfaces in proximity or in contact.

A fourth aspect of the invention provides a method for forming at least a portion of a three-dimensional structure having a desired configuration, includes: (a) forming at least first, second, and third portions of a structure from a plurality of adhered layers of at least one structural material where the first portion has a first surface and the second portion has a second surface and the third portion has a third surface, where the first and second surfaces are separated from one another during formation of the layers but which are to be located in contact or in proximity to one another in the desired configuration, and wherein the third surface is separated from the first and second portions during formation but is to be located in contact or in proximity to a surface of one of the first or second portions in the desired configuration; and (b) moving at least one of the first and second portions relative to the other to bring the first and second surfaces into contact or into proximity; (c) moving at least one of the third or contacting or proximate first and second portions relative to one another to bring the first, second, and third and portions into contact or into proximity.

A fifth aspect of the invention provides a method for forming a multi-element three-dimensional structure, including: (a) forming a first element of the multi-element three-dimensional structure from a plurality of successively formed layers, wherein each successive layer comprises at least two materials and is formed on and adhered to a previously formed layer, one of the at least two materials is a structural material and the other of the at least two materials is a sacrificial material, and wherein each successive layer defines a successive cross-section of the three-dimensional structure, and wherein the forming of each of the plurality of successive layers comprises: (i) depositing a first of the at least two materials; (ii) depositing a second of the at least two materials; (iii) planarizing the first and second materials; and (b) after the forming of the plurality of successive layers, separating at least a portion of the sacrificial material from multiple layers of the structural material to reveal the first element of the multi-element three-dimensional structure; (c) supplying a second element of the multi-element three-dimensional structure; and (d) bringing the first and second elements into contact or proximity with one another and elastically deforming at least an initial deformation portion of one of the elements relative to the other element to bring the at least two elements into a desired retention configuration which is maintained at least initially at least in part by the structural strength of the elements and the at least partial reformation of the deformation portion as the elements move into the retention configuration.

Numerous variations of the second through fifth aspects of the invention exist and may include, for example, the variations of the first aspect of the invention mutatis mutandis. as noted above with appropriate changes made.

Other aspects of the invention will be understood by those of skill in the art upon review of the teachings herein. Other aspects of the invention may involve combinations of the above noted aspects of the invention. Other aspects of the invention may involve apparatus that can be used in implementing one or more of the above method aspects of the invention or devices formed from utilization of the method aspects of the invention. These other aspects of the invention may provide various combinations of the aspects presented above as well as provide other configurations, structures, functional relationships, and processes that have not been specifically set forth above.

It is intended that the aspects of the invention set forth herein represent independent invention descriptions which Applicant contemplates as full and complete invention descriptions that Applicant believes may be set forth as independent claims without need of importing additional limitations or elements from other embodiments or aspects set forth herein for interpretation or clarification other than when explicitly set forth in such independent claims once written. It is also understood that any variations of the aspects set forth herein represent individual and separate features that may be individually added to independent claims or dependent claims to further define an invention being claimed.

BRIEF DESCRIPTION OF THE DRAWINGS

FIGS. 4A-4F schematically depict the formation of a first layer of a structure using adhered mask plating where the blanket deposition of a second material overlays both the openings between deposition locations of a first material and the first material itself FIG. 4G depicts the completion of formation of the first layer resulting from planarizing the deposited materials to a desired level.

FIGS. 4H and 4I respectively depict the state of the process after formation of the multiple layers of the structure and after release of the structure from the sacrificial material.

DETAILED DESCRIPTION OF PREFERRED EMBODIMENTS

Electrochemical Fabrication in General

Figure 1A:
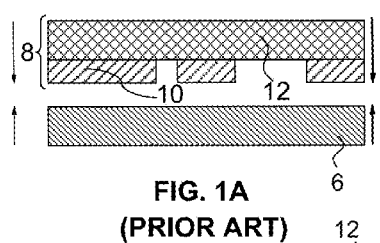
FIGS. 1A-1C schematically depict side views of various stages of a CC mask plating process, while FIGS. 1D-1G schematically depict a side views of various stages of a CC mask plating process using a different type of CC mask.
Figure 1B:
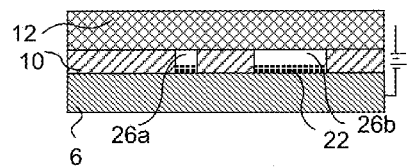
Figure 1C:
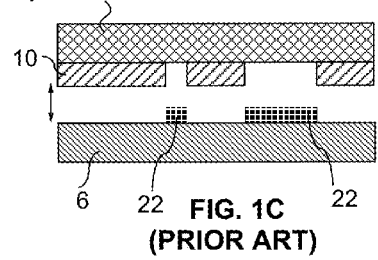
Figure 1D:
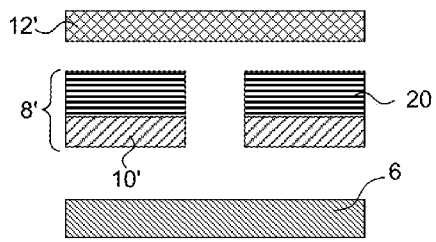
Figure 1E:
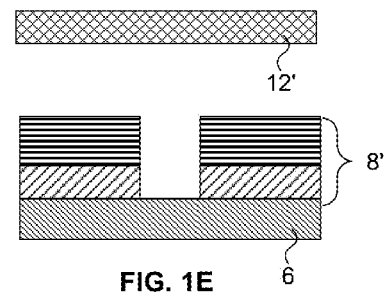
Figure 1F:
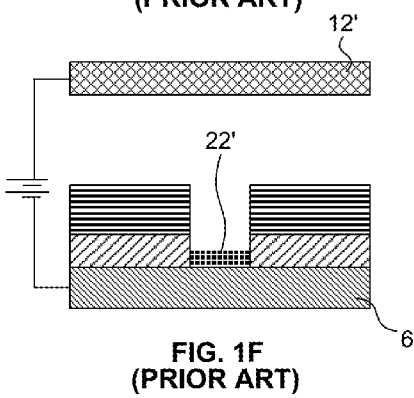
Figure 1G:
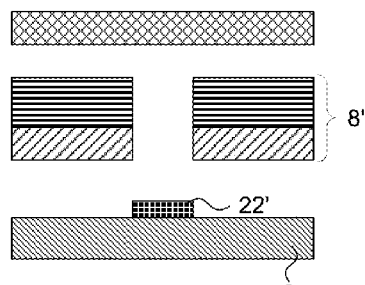
Figure 2A:
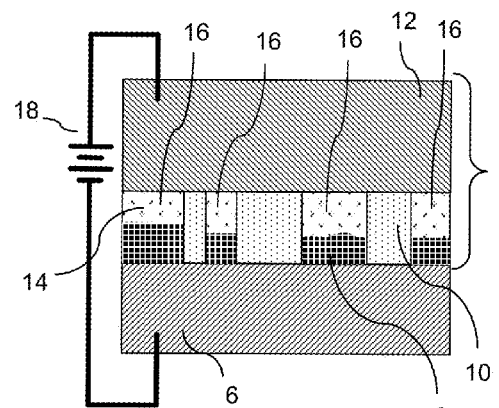
FIGS. 2A-2F schematically depict side views of various stages of an electrochemical fabrication process as applied to the formation of a particular structure where a sacrificial material is selectively deposited while a structural material is blanket deposited.
Figure 2B:
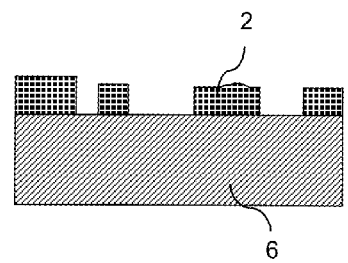
Figure 2C:
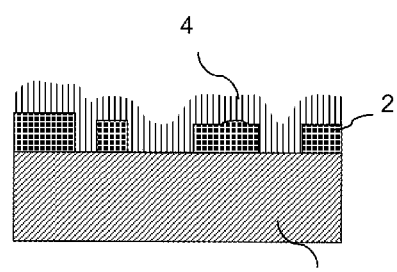
Figure 2D:
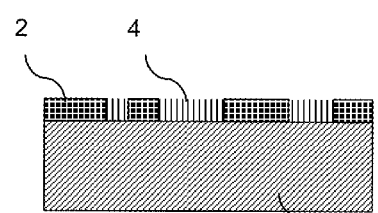
Figure 2E:
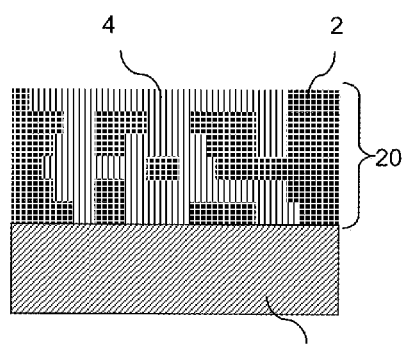
Figure 2F:
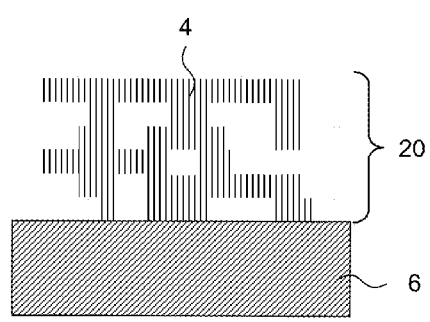
Figure 3A:
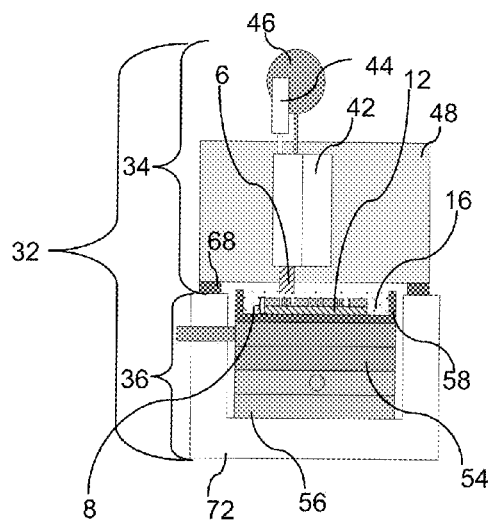
FIGS. 3A-3C schematically depict side views of various example subassemblies that may be used in manually implementing the electrochemical fabrication method depicted in FIGS. 2A-2F.
Figure 3B:
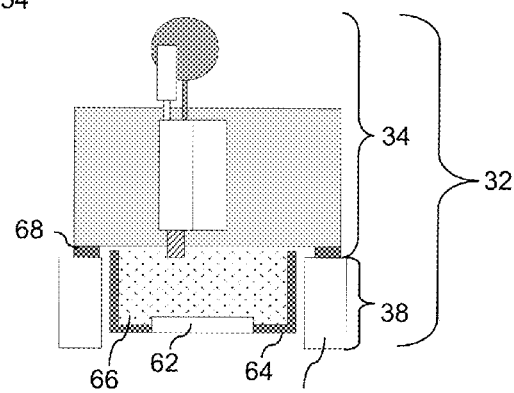
Figure 3C:
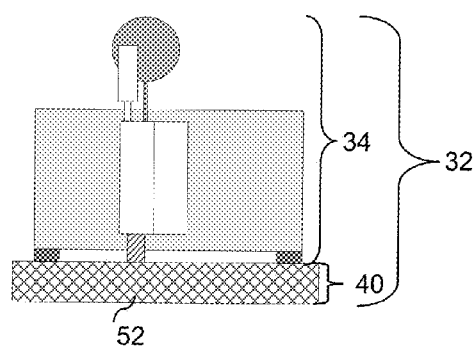

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

FIGS. 4A-4I illustrate various stages in the formation of a single layer of a multi-layer fabrication process where a second metal is deposited on a first metal as well as in openings in the first metal so that the first and second metal form part of the layer. In FIG. 4A a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D a metal 94 (e.g. nickel) is shown as having been electroplated into the openings 92(a)-92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

Various embodiments of various aspects of the invention are directed to formation of three-dimensional structures from materials some of which may be electrodeposited or electroless deposited. Some of these structures may be formed form a single build level formed from one or more deposited materials while others are formed from a plurality of build layers each including at least two materials (e.g. two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used. In some embodiments structures having features positioned with micron level precision and minimum features size on the order of tens of microns are to be formed. In other embodiments structures with less precise feature placement and/or larger minimum features may be formed. In still other embodiments, higher precision and smaller minimum feature sizes may be desirable. In the present application meso-scale and millimeter scale have the same meaning and refer to devices that may have one or more dimensions extending into the 0.5-20 millimeter range, or somewhat larger and with features positioned with precision in the 10-100 micron range and with minimum features sizes on the order of 100 microns.

The various embodiments, alternatives, and techniques disclosed herein may form multi-layer structures using a single patterning technique on all layers or using different patterning techniques on different layers. For example, Various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e. the exposed portions of the surface are to be treated). These masks can generally be removed without damaging the mask or the surface that received treatment to which they were contacted, or located in proximity to. Adhered masks are generally formed on the surface to be treated (i.e. the portion of that surface that is to be masked) and bonded to that surface such that they cannot be separated from that surface without being completely destroyed damaged beyond any point of reuse. Adhered masks may be formed in a number of ways including (1) by application of a photoresist, selective exposure of the photoresist, and then development of the photoresist, (2) selective transfer of pre-patterned masking material, and/or (3) direct formation of masks from computer controlled depositions of material.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e. regions that lie within the top and bottom boundary levels that define a different layer's geometric configuration). Such use of selective etching and interlaced material deposition in association with multiple layers is described in U.S. patent application Ser. No. 10/434,519, by Smalley, now U.S. Pat. No. 7,252,861, and entitled "Methods of and Apparatus for Electrochemically Fabricating Structures Via Interlaced Layers or Via Selective Etching and Filling of Voids layer elements" which is hereby incorporated herein by reference as if set forth in full.

Temporary substrates on which structures may be formed may be of the sacrificial-type (i.e. destroyed or damaged during separation of deposited materials to the extent they can not be reused), non-sacrificial-type (i.e. not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g. replanarizing one or more selected surfaces or applying a release layer, and the like) though they may or may not be reused for a variety of reasons.

Definitions

This section of the specification is intended to set forth definitions for a number of specific terms that may be useful in describing the subject matter of the various embodiments of the invention. It is believed that the meanings of most if not all of these terms is clear from their general use in the specification but they are set forth hereinafter to remove any ambiguity that may exist. It is intended that these definitions be used in understanding the scope and limits of any claims that use these specific terms. As far as interpretation of the claims of this patent disclosure are concerned, it is intended that these definitions take presence over any contradictory definitions or allusions found in any materials which are incorporated herein by reference.

"Build" as used herein refers, as a verb, to the process of building a desired structure or plurality of structures from a plurality of applied or deposited materials which are stacked and adhered upon application or deposition or, as a noun, to the physical structure or structures formed from such a process. Depending on the context in which the term is used, such physical structures may include a desired structure embedded within a sacrificial material or may include only desired physical structures which may be separated from one another or may require dicing and/or slicing to cause separation.

"Build axis" or "build orientation" is the axis or orientation that is substantially perpendicular to substantially planar levels of deposited or applied materials that are used in building up a structure. The planar levels of deposited or applied materials may be or may not be completely planar but are substantially so in that the overall extent of their cross-sectional dimensions are significantly greater than the height of any individual deposit or application of material (e.g. 100, 500, 1000, 5000, or more times greater). The planar nature of the deposited or applied materials may come about from use of a process that leads to planar deposits or it may result from a planarization process (e.g. a process that includes mechanical abrasion, e.g. lapping, fly cutting, grinding, or the like) that is used to remove material regions of excess height. Unless explicitly noted otherwise, "vertical" as used herein refers to the build axis or nominal build axis (if the layers are not stacking with perfect registration) while "horizontal" refers to a direction within the plane of the layers (i.e. the plane that is substantially perpendicular to the build axis).

"Build layer" or "layer of structure" as used herein does not refer to a deposit of a specific material but instead refers to a region of a build located between a lower boundary level and an upper boundary level which generally defines a single cross-section of a structure being formed or structures which are being formed in parallel. Depending on the details of the actual process used to form the structure, build layers are generally formed on and adhered to previously formed build layers. In some processes the boundaries between build layers are defined by planarization operations which result in successive build layers being formed on substantially planar upper surfaces of previously formed build layers. In some embodiments, the substantially planar upper surface of the preceding build layer may be textured to improve adhesion between the layers. In other build processes, openings may exist in or be formed in the upper surface of a previous but only partially formed build layers such that the openings in the previous build layers are filled with materials deposited in association with current build layers which will cause interlacing of build layers and material deposits. Such interlacing is described in U.S. patent application Ser. No. 10/434,519 now U.S. Pat. No. 7,252,861. This referenced application is incorporated herein by reference as if set forth in full. In most embodiments, a build layer includes at least one primary structural material and at least one primary sacrificial material. However, in some embodiments, two or more primary structural materials may be used without a primary sacrificial material (e.g. when one primary structural material is a dielectric and the other is a conductive material). In some embodiments, build layers are distinguishable from each other by the source of the data that is used to yield patterns of the deposits, applications, and/or etchings of material that form the respective build layers. For example, data descriptive of a structure to be formed which is derived from data extracted from different vertical levels of a data representation of the structure define different build layers of the structure. The vertical separation of successive pairs of such descriptive data may define the thickness of build layers associated with the data. As used herein, at times, "build layer" may be loosely referred simply as "layer". In many embodiments, deposition thickness of primary structural or sacrificial materials (i.e. the thickness of any particular material after it is deposited) is generally greater than the layer thickness and a net deposit thickness is set via one or more planarization processes which may include, for example, mechanical abrasion (e.g. lapping, fly cutting, polishing, and the like) and/or chemical etching (e.g. using selective or non-selective etchants). The lower boundary and upper boundary for a build layer may be set and defined in different ways. From a design point of view they may be set based on a desired vertical resolution of the structure (which may vary with height). From a data manipulation point of view, the vertical layer boundaries may be defined as the vertical levels at which data descriptive of the structure is processed or the layer thickness may be defined as the height separating successive levels of cross-sectional data that dictate how the structure will be formed. From a fabrication point of view, depending on the exact fabrication process used, the upper and lower layer boundaries may be defined in a variety of different ways. For example by planarization levels or effective planarization levels (e.g. lapping levels, fly cutting levels, chemical mechanical polishing levels, mechanical polishing levels, vertical positions of structural and/or sacrificial materials after relatively uniform etch back following a mechanical or chemical mechanical planarization process). For example, by levels at which process steps or operations are repeated. At levels at which, at least theoretically, lateral extends of structural material can be changed to define new cross-sectional features of a structure.

"Layer thickness" is the height along the build axis between a lower boundary of a build layer and an upper boundary of that build layer.

"Planarization" is a process that tends to remove materials, above a desired plane, in a substantially non-selective manner such that all deposited materials are brought to a substantially common height or desired level (e.g. within 20%, 10%, 5%, or even 1% of a desired layer boundary level). For example, lapping removes material in a substantially non-selective manner though some amount of recession one material or another may occur (e.g. copper may recess relative to nickel). Planarization may occur primarily via mechanical means, e.g. lapping, grinding, fly cutting, milling, sanding, abrasive polishing, frictionally induced melting, other machining operations, or the like (i.e. mechanical planarization). Mechanical planarization maybe followed or proceeded by thermally induced planarization (.e.g. melting) or chemically induced planarization (e.g. etching). Planarization may occur primarily via a chemical and/or electrical means (e.g. chemical etching, electrochemical etching, or the like). Planarization may occur via a simultaneous combination of mechanical and chemical etching (e.g. chemical mechanical polishing (CMP)).

"Structural material" as used herein refers to a material that remains part of the structure when put into use.

"Supplemental structural material" as used herein refers to a material that forms part of the structure when the structure is put to use but is not added as part of the build layers but instead is added to a plurality of layers simultaneously (e.g. via one or more coating operations that applies the material, selectively or in a blanket fashion, to a one or more surfaces of a desired build structure that has been released from a sacrificial material.

"Primary structural material" as used herein is a structural material that forms part of a given build layer and which is typically deposited or applied during the formation of that build layer and which makes up more than 20% of the structural material volume of the given build layer. In some embodiments, the primary structural material may be the same on each of a plurality of build layers or it may be different on different build layers. In some embodiments, a given primary structural material may be formed from two or more materials by the alloying or diffusion of two or more materials to form a single material.

"Secondary structural material" as used herein is a structural material that forms part of a given build layer and is typically deposited or applied during the formation of the given build layer but is not a primary structural material as it individually accounts for only a small volume of the structural material associated with the given layer. A secondary structural material will account for less than 20% of the volume of the structural material associated with the given layer. In some preferred embodiments, each secondary structural material may account for less than 10%, 5%, or even 2% of the volume of the structural material associated with the given layer. Examples of secondary structural materials may include seed layer materials, adhesion layer materials, barrier layer materials (e.g. diffusion barrier material), and the like. These secondary structural materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Functional structural material" as used herein is a structural material that would have been removed as a sacrificial material but for its actual or effective encapsulation by other structural materials. Effective encapsulation refers, for example, to the inability of an etchant to attack the functional structural material due to inaccessibility that results from a very small area of exposure and/or due to an elongated or tortuous exposure path. For example, large (10,000 µm$^2$) but thin (e.g. less than 0.5 microns) regions of sacrificial copper sandwiched between deposits of nickel may define regions of functional structural material depending on ability of a release etchant to remove the sandwiched copper.

"Sacrificial material" is material that forms part of a build layer but is not a structural material. Sacrificial material on a given build layer is separated from structural material on that build layer after formation of that build layer is completed and more generally is removed from a plurality of layers after completion of the formation of the plurality of layers during a "release" process that removes the bulk of the sacrificial material or materials. In general sacrificial material is located on a build layer during the formation of one, two, or more subsequent build layers and is thereafter removed in a manner that does not lead to a planarized surface. Materials that are applied primarily for masking purposes, i.e. to allow subsequent selective deposition or etching of a material, e.g. photoresist that is used in forming a build layer but does not form part of the build layer) or that exist as part of a build for less than one or two complete build layer formation cycles are not considered sacrificial materials as the term is used herein but instead shall be referred as masking materials or as temporary materials. These separation processes are sometimes referred to as a release process and may or may not involve the separation of structural material from a build substrate. In many embodiments, sacrificial material within a given build layer is not removed until all build layers making up the three-dimensional structure have been formed. Of course sacrificial material may be, and typically is, removed from above the upper level of a current build layer during planarization operations during the formation of the current build layer. Sacrificial material is typically removed via a chemical etching operation but in some embodiments may be removed via a melting operation or electrochemical etching operation. In typical structures, the removal of the sacrificial material (i.e. release of the structural material from the sacrificial material) does not result in planarized surfaces but instead results in surfaces that are dictated by the boundaries of structural materials located on each build layer. Sacrificial materials are typically distinct from structural materials by having different properties therefrom (e.g. chemical etchability, hardness, melting point, etc.) but in some cases, as noted previously, what would have been a sacrificial material may become a structural material by its actual or effective encapsulation by other structural materials. Similarly, structural materials may be used to form sacrificial structures that are separated from a desired structure during a release process via the sacrificial structures being only attached to sacrificial material or potentially by dissolution of the sacrificial structures themselves using a process that is insufficient to reach structural material that is intended to form part of a desired structure. It should be understood that in some embodiments, small amounts of structural material may be removed, after or during release of sacrificial material. Such small amounts of structural material may have been inadvertently formed due to imperfections in the fabrication process or may result from the proper application of the process but may result in features that are less than optimal (e.g. layers with stairs steps in regions where smooth sloped surfaces are desired. In such cases the volume of structural material removed is typically minuscule compared to the amount that is retained and thus such removal is ignored when labeling materials as sacrificial or structural. Sacrificial materials are typically removed by a dissolution process, or the like, that destroys the geometric configuration of the sacrificial material as it existed on the build layers. In many embodiments, the sacrificial material is a conductive material such as a metal. As will be discussed hereafter, masking materials though typically sacrificial in nature are not termed sacrificial materials herein unless they meet the required definition of sacrificial material.

"Supplemental sacrificial material" as used herein refers to a material that does not form part of the structure when the structure is put to use and is not added as part of the build layers but instead is added to a plurality of layers simultaneously (e.g. via one or more coating operations that applies the material, selectively or in a blanket fashion, to a one or more surfaces of a desired build structure that has been released from an initial sacrificial material. This supplemental sacrificial material will remain in place for a period of time and/or during the performance of certain post layer formation operations, e.g. to protect the structure that was released from a primary sacrificial material, but will be removed prior to putting the structure to use.

"Primary sacrificial material" as used herein is a sacrificial material that is located on a given build layer and which is typically deposited or applied during the formation of that build layer and which makes up more than 20% of the sacrificial material volume of the given build layer. In some embodiments, the primary sacrificial material may be the same on each of a plurality of build layers or may be different on different build layers. In some embodiments, a given primary sacrificial material may be formed from two or more materials by the alloying or diffusion of two or more materials to form a single material.

"Secondary sacrificial material" as used herein is a sacrificial material that is located on a given build layer and is typically deposited or applied during the formation of the build layer but is not a primary sacrificial materials as it individually accounts for only a small volume of the sacrificial material associated with the given layer. A secondary sacrificial material will account for less than 20% of the volume of the sacrificial material associated with the given layer. In some preferred embodiments, each secondary sacrificial material may account for less than 10%, 5%, or even 2% of the volume of the sacrificial material associated with the given layer. Examples of secondary structural materials may include seed layer materials, adhesion layer materials, barrier layer materials (e.g. diffusion barrier material), and the like. These secondary sacrificial materials are typically applied to form coatings having thicknesses less than 2 microns, 1 micron, 0.5 microns, or even 0.2 microns). The coatings may be applied in a conformal or directional manner (e.g. via CVD, PVD, electroless deposition, or the like). Such coatings may be applied in a blanket manner or in a selective manner. Such coatings may be applied in a planar manner (e.g. over previously planarized layers of material) as taught in U.S. patent application Ser. No. 10/607,931, now U.S. Pat. No. 7,239,219. In other embodiments, such coatings may be applied in a non-planar manner, for example, in openings in and over a patterned masking material that has been applied to previously planarized layers of material as taught in U.S. patent application Ser. No. 10/841,383, now U.S. Pat. No. 7,195,989. These referenced applications are incorporated herein by reference as if set forth in full herein.

"Adhesion layer", "seed layer", "barrier layer", and the like refer to coatings of material that are thin in comparison to the layer thickness and thus generally form secondary structural material portions or sacrificial material portions of some layers. Such coatings may be applied uniformly over a previously formed build layer, they may be applied over a portion of a previously formed build layer and over patterned structural or sacrificial material existing on a current (i.e. partially formed) build layer so that a non-planar seed layer results, or they may be selectively applied to only certain locations on a previously formed build layer. In the event such coatings are non-selectively applied, selected portions may be removed (1) prior to depositing either a sacrificial material or structural material as part of a current layer or (2) prior to beginning formation of the next layer or they may remain in place through the layer build up process and then etched away after formation of a plurality of build layers.

"Masking material" is a material that may be used as a tool in the process of forming a build layer but does not form part of that build layer. Masking material is typically a photopolymer or photoresist material or other material that may be readily patterned. Masking material is typically a dielectric. Masking material, though typically sacrificial in nature, is not a sacrificial material as the term is used herein. Masking material is typically applied to a surface during the formation of a build layer for the purpose of allowing selective deposition, etching, or other treatment and is removed either during the process of forming that build layer or immediately after the formation of that build layer.

"Multilayer structures" are structures formed from multiple build layers of deposited or applied materials.

"Multilayer three-dimensional (or 3D or 3-D) structures" are Multilayer Structures that meet at least one of two criteria: (1) the structural material portion of at least two layers of which one has structural material portions that do not overlap structural material portions of the other.

"Complex multilayer three-dimensional (or 3D or 3-D) structures" are multilayer three-dimensional structures formed from at least three layers where a line may be defined that hypothetically extends vertically through at least some portion of the build layers of the structure will extend from structural material through sacrificial material and back through structural material or will extend from sacrificial material through structural material and back through sacrificial material (these might be termed vertically complex multilayer three-dimensional structures). Alternatively, complex multilayer three-dimensional structures may be defined as multilayer three-dimensional structures formed from at least two layers where a line may be defined that hypothetically extends horizontally through at least some portion of a build layer of the structure that will extend from structural material through sacrificial material and back through structural material or will extend from sacrificial material through structural material and back through sacrificial material (these might be termed horizontally complex multilayer three-dimensional structures). Worded another way, in complex multilayer three-dimensional structures, a vertically or horizontally extending hypothetical line will extend from one or structural material or void (when the sacrificial material is removed) to the other of void or structural material and then back to structural material or void as the line is traversed along at least a portion of the line.

"Moderately complex multilayer three-dimensional (or 3D or 3-D) structures are complex multilayer 3D structures for which the alternating of void and structure or structure and void not only exists along one of a vertically or horizontally extending line but along lines extending both vertically and horizontally.

"Highly complex multilayer (or 3D or 3-D) structures are complex multilayer 3D structures for which the structure-to-void-to-structure or void-to-structure-to-void alternating occurs once along the line but occurs a plurality of times along a definable horizontally or vertically extending line.

"Up-facing feature" is an element dictated by the cross-sectional data for a given build layer "n" and a next build layer "n+1" that is to be formed from a given material that exists on the build layer "n" but does not exist on the immediately succeeding build layer "n+1". For convenience the term "up-facing feature" will apply to such features regardless of the build orientation.

"Down-facing feature" is an element dictated by the cross-sectional data for a given build layer "n" and a preceding build layer "n−1" that is to be formed from a given material that exists on build layer "n" but does not exist on the immediately preceding build layer "n−1". As with up-facing features, the term "down-facing feature" shall apply to such features regardless of the actual build orientation.

"Continuing region" is the portion of a given build layer "n" that is dictated by the cross-sectional data for the given build layer "n", a next build layer "n+1" and a preceding build layer "n−1" that is neither up-facing nor down-facing for the build layer "n".

"Minimum feature size" or "MFS" refers to a necessary or desirable spacing between structural material elements on a given layer that are to remain distinct in the final device configuration. If the minimum feature size is not maintained for structural material elements on a given layer, the fabrication process may result in structural material inadvertently bridging what were intended to be two distinct elements (e.g. due to masking material failure or failure to appropriately fill voids with sacrificial material during formation of the given layer such that during formation of a subsequent layer structural material inadvertently fills the void). More care during fabrication can lead to a reduction in minimum feature size. Alternatively, a willingness to accept greater losses in productivity (i.e. lower yields) can result in a decrease in the minimum feature size. However, during fabrication for a given set of process parameters, inspection diligence, and yield (successful level of production) a minimum design feature size is set in one way or another. The above described minimum feature size may more appropriately be termed minimum feature size of gaps or voids (e.g. the MFS for sacrificial material regions when sacrificial material is deposited first). Conversely a minimum feature size for structure material regions (minimum width or length of structural material elements) may be specified. Depending on the fabrication method and order of deposition of structural material and sacrificial material, the two types of minimum feature sizes may be the same or different. In practice, for example, using electrochemical fabrication methods as described herein, the minimum features size on a given layer may be roughly set to a value that approximates the layer thickness used to form the layer and it may be considered the same for both structural and sacrificial material widths. In some more rigorously implemented processes (e.g. with higher examination regiments and tolerance for rework), it may be set to an amount that is 80%, 50%, or even 30% of the layer thickness. Other values or methods of setting minimum feature sizes may be used. Worded another way, depending on the geometry of a structure, or plurality of structures, being formed, the structure, or structures, may include elements (e.g. solid regions) which have dimensions smaller than a first minimum feature size and/or have spacings, voids, openings, or gaps (e.g. hollow or empty regions) located between elements, where the spacings are smaller than a second minimum feature size where the first and second minimum feature sizes may be the same or different and where the minimum feature sizes represent lower limits at which formation of elements and/or spacing can be reliably formed. Reliable formation refers to the ability to accurately form or produce a given geometry of an element, or of the spacing between elements, using a given formation process, with a minimum acceptable yield. The minimum acceptable yield may depend on a number of factors including: (1) number of features present per layer, (2) numbers of layers, (3) the criticality of the successful formation of each feature, (4) the number and severity of other factors effecting overall yield, and (5) the desired or required overall yield for the structures or devices themselves. In some circumstances, the minimum size may be determined by a yield requirement per feature which is as low as 70%, 60%, or even 50%. While in other circumstances the yield requirement per feature may be as high as 90%, 95%, 99%, or even higher. In some circumstances (e.g. in producing a filter element) the failure to produce a certain number of desired features (e.g. 20-40% failure may be acceptable while in an electrostatic actuator the failure to produce a single small space between two moveable electrodes may result in failure of the entire device. The MFS, for example, may be defined as the minimum width of a narrow and processing element (e.g. photoresist element or sacrificial material element) or structural element (e.g. structural material element) that may be reliably formed (e.g. 90-99.9 times out of 100) which is either independent of any wider structures or has a substantial independent length (e.g. 200-1000 microns) before connecting to a wider region.

Rapid Multi-Layer Formation

The innovation relates to methods of producing devices using a modified electrochemical fabrication process such as those discussed above and/or using a laser cutting process such as those set forth in some of the patent applications referenced above. The methods can reduce the cost and lead time of prototyping when compared with previous multi-layer, multi-material electrochemical fabrication processes such as those discussed above, and can also reduce the lead time of production quantities, by allowing multiple layers of a multilayer device to be formed simultaneously, e.g. in parallel on the same wafer). Additionally, these methods may be used to extend the maximum height to which parts may practically be made, by providing effective methods for bonding together structures of partial height. Finally, the method allows geometries that are impossible, impractical or difficult to release (e.g. microfluidic devices such as pumps or parts with long, narrow channels) to be fabricated in two or more pieces and then joined and even sealed after full or partial release.

Figure 5A:
FIGS. 5A-5P depict in cross section a process flow of one embodiment.
Figure 5B:
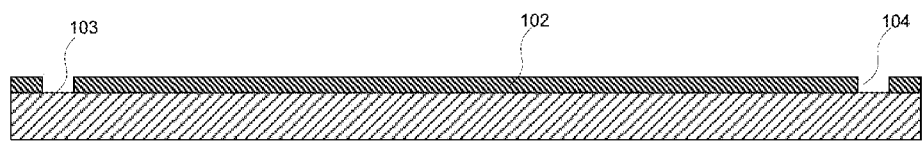
Figure 5C:
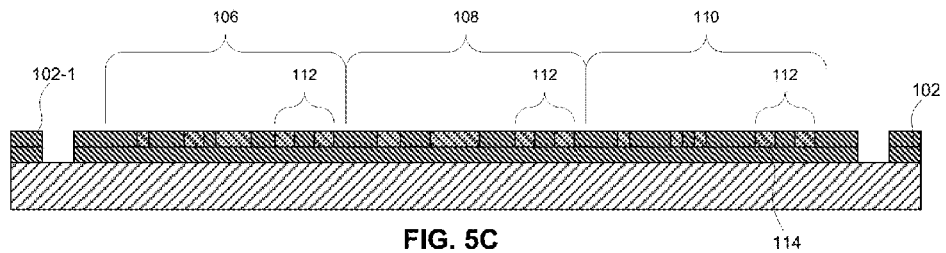
Figure 5D:
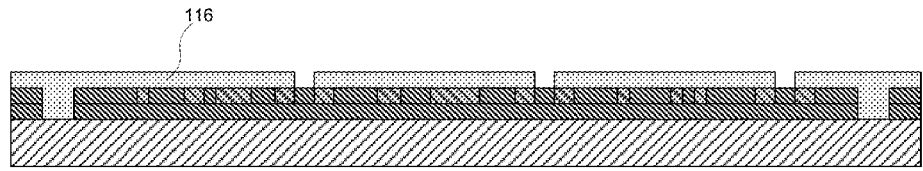
Figure 5E:
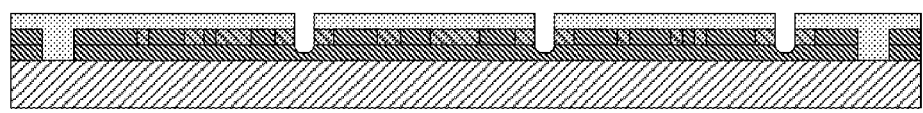
Figure 5F:
Figure 5G:
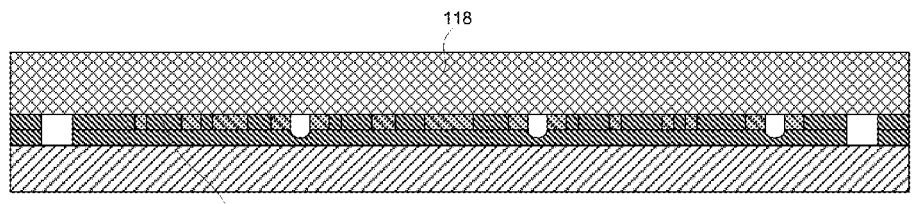
Figure 5H:
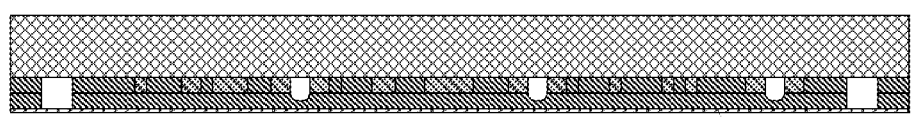
Figure 5I:
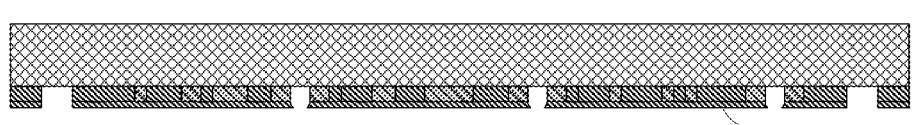
Figure 5J:
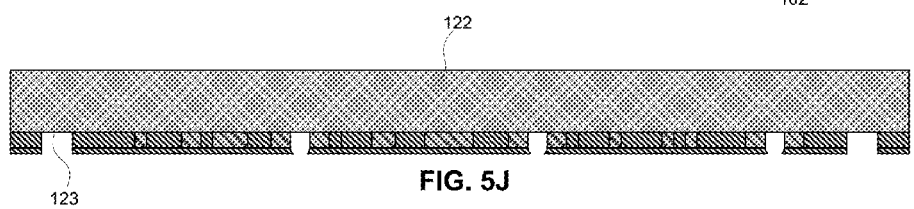
Figure 5K:
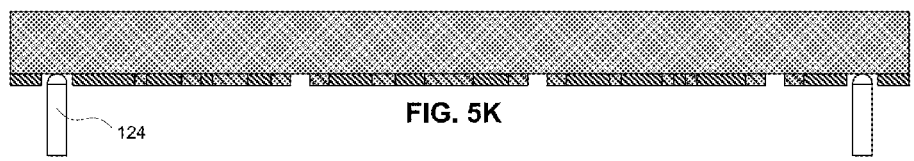
Figure 5L:
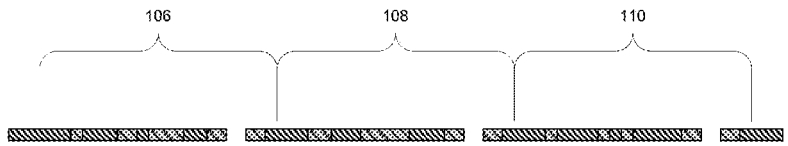
Figure 5M:
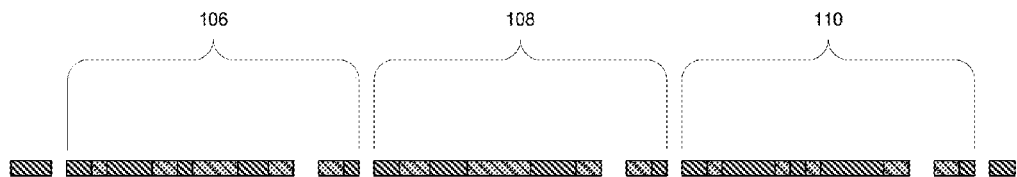
Figure 5N:
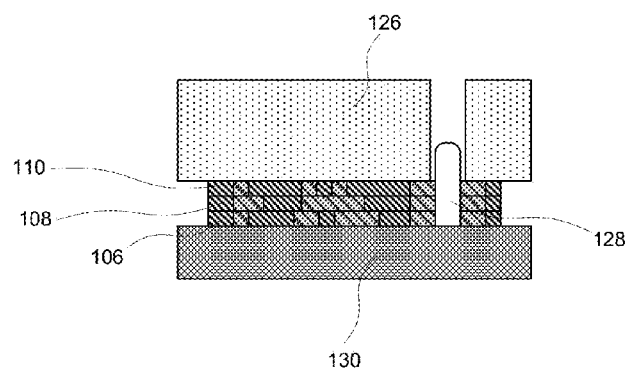
Figure 5O:
Figure 5P:
Figure 6:
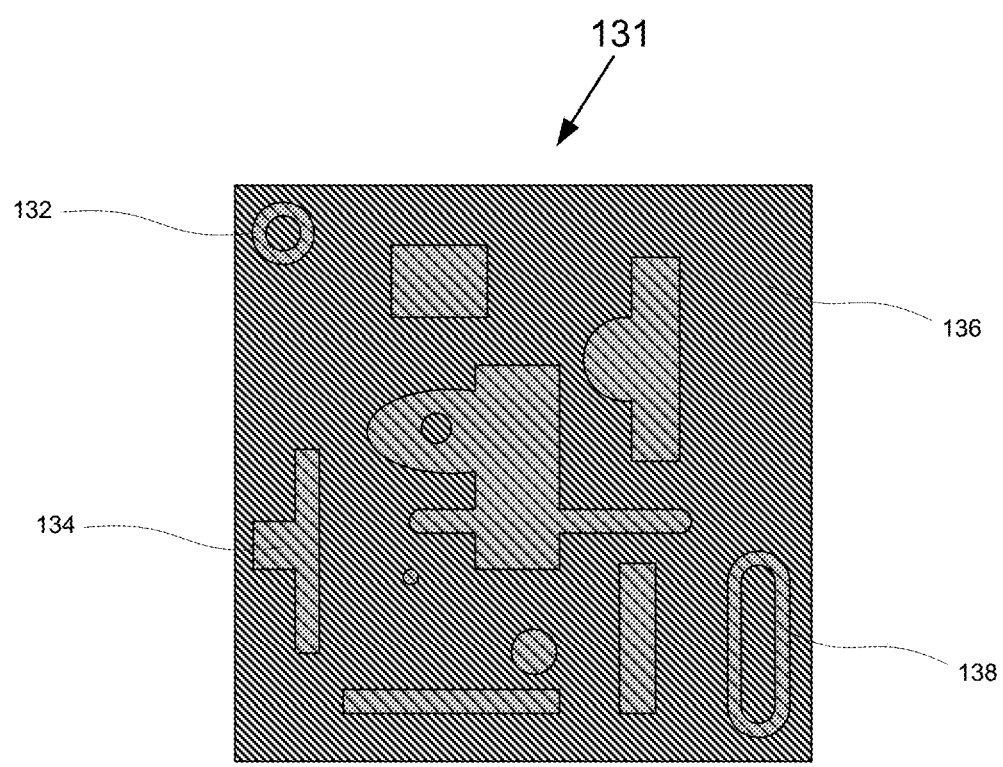
FIG. 6 depicts a top view of a sample cross-section of a single structure or group of structures including alignment features.

FIGS. 5A-5P depict in cross section a process flow of one embodiment. In FIG. 5A, a substrate 100 has been provided, and in FIG. 5B, a sacrificial material 102 has been deposited on it. In some embodiments, the surface of the sacrificial material 102 is made extremely smooth such that the lower surface of the material deposited onto it will also be smooth. In some embodiments, apertures 104 are provided in the sacrificial material 102 through which measurement probes can pass to access the reference surface 103 that may be used to measure the endpoint of planarization. In FIG. 5C, a single multi-material layer has been produced from structural material 114 and sacrificial material 102-1 (e.g. a layer including lateral portions of one or more structural materials and other lateral portions with one or more sacrificial materials). In some embodiments the layer comprises multiple die three of which are shown in the figure (i.e. Die 1 106, Die 2 108, and Die 3 110). In some embodiments the individual die may represent one or more copies of each of a plurality of cross sections which will be stacked in a desired order to a desired height to produce a desired multi-layer part; in some embodiments, the die may include a plurality of different cross-sections for a plurality of different parts that may be formed by stacking the individual cross-sections in a desired order to a desired height; while in still other embodiments, the die may represent a single cross-section of one or more parts that will be combined with one or more dies formed on one or more different substrates to produce one or more different parts. Also shown in cross section is a ring 112 of structural material 114 which is provided (in this example) for purposes of alignment. As shown in FIG. 6, a ring 132 of structural material 134 surrounded by sacrificial material 136 is one of at least two alignment features on the layer provided for each die 131 (only one die is shown). In some embodiments, where bonding will occur not on a die-by-die basis but on the basis of groups of die or on even a whole layer basis, the alignment features may not be provided die-by-die but instead group-by-group or layer-by-layer. A slot 138 that is fabricated similarly to the ring 132 (e.g., as an elongated ring, or 'racetrack' shape) may also be provided; this is located preferably at a large distance from the ring (e.g., diagonally opposite it on the die, as shown) and may be preferred over a ring as the second alignment feature in order to not over constrain the alignment. When not necessary to distinguish these different shaped closed loop elements, they may both be referred to as rings. In FIG. 5D photoresist 116 has been patterned over the layer so as to expose the centers of the rings. In FIG. 5E the sacrificial material in the centers of the rings have been selectively etched out through apertures in the photoresist and in FIG. 5F the photoresist has been stripped.

In FIG. 5G, a handle wafer 118 with a flat mating surface 120 has been attached to the surface of the layer, preferably using a material that is easily removed such as wax. The upper surface of the handle is preferably very parallel to the mating surface. In FIG. 5H, the substrate 100 has been sawed, or machined down, so that only a thin portion of it remains, and in FIG. 5I, the remainder of the substrate, and possibly some of the sacrificial material 102 below the layer, has been removed, e.g., by a lapping process. In FIG. 5J, the handle has been detached from the layer, any adhesive residues used to mount the layer to the handle have been removed, leaving behind a clean layer surface, and the layer has been placed on a vacuum chuck 122. In FIG. 5K, any remaining sacrificial material below the layer has been removed (e.g., by single point diamond machining, CMP, or slurry- or fixed abrasive-based lapping) and in some embodiments, a portion of the thickness of the layer has also been removed, resulting in a layer of the desired thickness and parallelism. The final thickness and parallelism of the layer may be determined using a probe 124 that references off the vacuum chuck surface 123 (as can be seen in FIG. 5J), serving as planarization end-pointing pads accessed through windows in the layer. In some embodiments, the surface is polished (e.g. mechanically or electrochemically).

In FIG. 5L, the layer has been released from the vacuum chuck and the location of the three die are also shown in the figure. In FIG. 5M, the die have been singulated (e.g., by cutting manually or automatically with scissors, a razor blade, or the like). In FIG. 5N, the die have been stacked in the desired order in a fixture which includes an alignment pin 128 for every ring stack. These pins are preferably very well controlled in diameter and circularity. The die are loaded into the fixture such that the pins pass through the rings, mechanically aligning them. The leading (e.g., top) end of the pins in some embodiments may be tapered, radiused, or chamfered to facilitate insertion of the pins and thus loading of die onto the fixture. Die and fixture are preferably cleaned and brought together in a cleanroom or similar environment. Cleaning of the surfaces to be bonded may involve chemicals, plasma, or other methods.

The pins are preferably comparable in size with the inner dimension of the rings, providing accurate alignment of the die with respect to the pins and thus, with respect to one another. The fixture may include a base 130 and a weight 126 which presses on the stack with enough force to bring the die into intimate contact. In some embodiments, the die are subsequently bonded to one another. Bonding methods may include solid state welding, diffusion bonding (e.g., heating according to a suitable time/temperature recipe in an inert or reducing gas), diffusion welding, cold welding, forge welding, diffusion brazing (e.g., activated diffusion bonding or transient liquid-phase bonding), induction welding, explosion bonding, laser or e-beam melting and glazing, and cladding (including laser cladding). In some embodiments, bonding due to Van der Waal's forces can be achieved by polishing the sacrificial material onto which the structural material is deposited, as well as the top surface of the structural material, to a very high degree of smoothness. In some embodiments, stacking and bonding may occur by adding one layer at a time and then bonding, by adding a plurality of layers at a time and then bonding, or adding all layers and then bonding. In some embodiments, a thin layer of bonding material may be formed on the top of the layer or at the bottom of the layer such that when pressed together or heated the bonding material aids in or causes bonding to occur. Such application may be by electrodeposition, electroless deposition, CVD, PVD, or the like. The bonding material may be the same as a sacrificial material but applied in such a thin layer that etching cannot remove it when layers are pressed tight together.

In some embodiments, the pins, the base, and/or the weight are made from, or coated with, a material (e.g., ceramic, graphite, or an anodized film on aluminum) that cannot easily fuse to the die during bonding. In some embodiments the base and/or weight are made largely from a material that is relatively closely matched in coefficient of thermal expansion with the die so that the distance between the pins and the rings change similarly with temperature.

In some embodiments, the pins may have a slightly smaller diameter than the rings for ease of loading and thereafter be made to expand, or expand more rapidly than the rings so that small gaps between the inner surfaces of the rings and the pins are filled and thus the lateral alignment of the individual layers improved prior to bonding being completed. Expansion of the pins may occur in a variety of ways, for example, by use of an appropriate CTE and selective heating (e.g. via laser radiation), via CTE differential and blanket heating (e.g. placement in an oven or general radiation bombardment), via the pins being formed from a shape memory alloy and heating to cause return to its original shape. In some embodiments, the pins may take the form of low force spring pins that can be driven relative easily into the ring openings while still providing significant lateral alignment. In some embodiments, the pins may have a multi-part configuration such as a first part including an expandable outer ring like surface and an interior part capable of receiving a wedge-like insert which causes expansion and lateral alignment. In some embodiments, the alignment pins may be separate from the fixture or separable from the fixture while in others they may be a permanent part of the fixture. In some embodiments, fixtures may be custom made for each build while in others fixtures may take on one or more standardized configurations and parts may be laid out to match the standardized ring configurations. In some embodiments, the pins may become a permanent part of the parts being formed.

In FIG. 5O, the bonded die have been removed from the fixture. In FIG. 5P, the sacrificial material has been etched, producing a multi-layer device. In some embodiments, multiple parts, may still be joined by sacrificial material (i.e. not diced) and may be set into fixtures simultaneously and bonded simultaneously, such that after release from sacrificial material multiple identical or different multi-layer parts are formed.

Figure 7A:
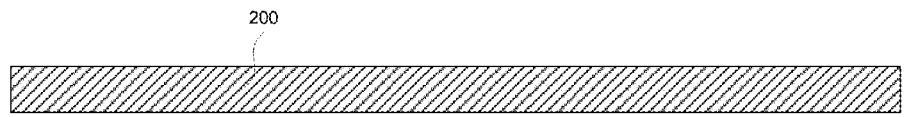
FIGS. 7A-7O depict, in cross section, a process flow of another embodiment.
Figure 7B:
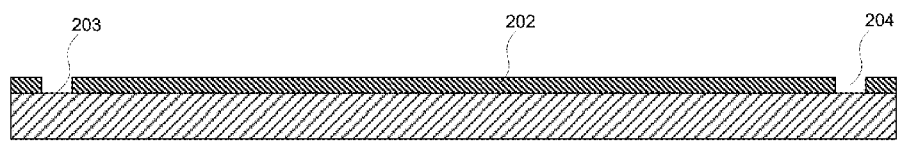
Figure 7C:
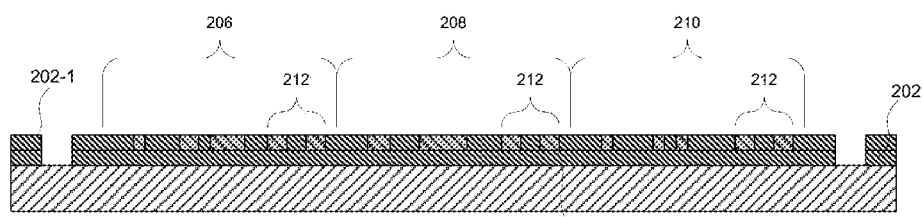
Figure 7D:
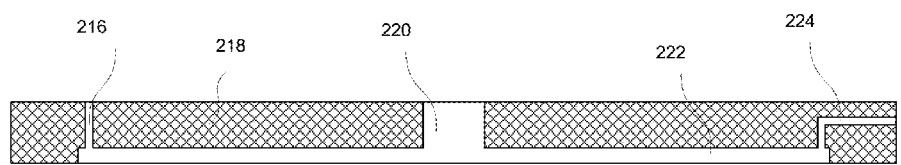
Figure 7E:
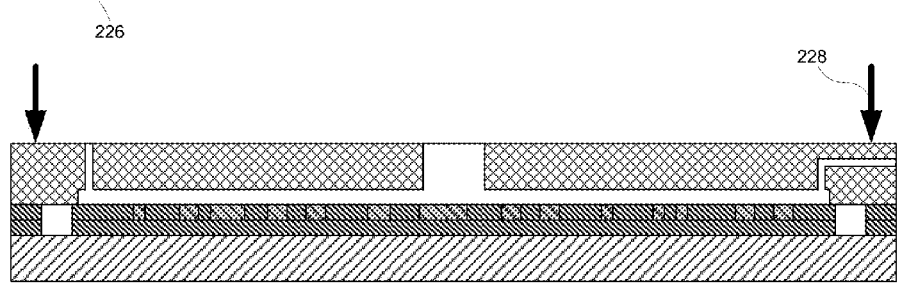
Figure 7F:
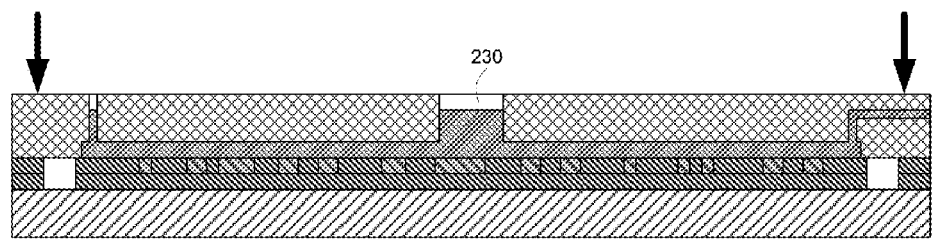
Figure 7G:
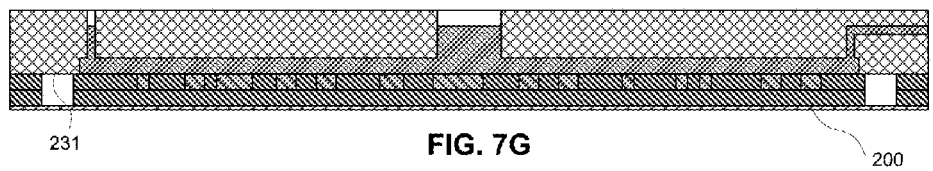
Figure 7H:
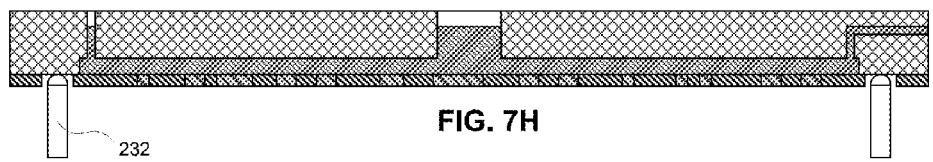
Figure 7I:
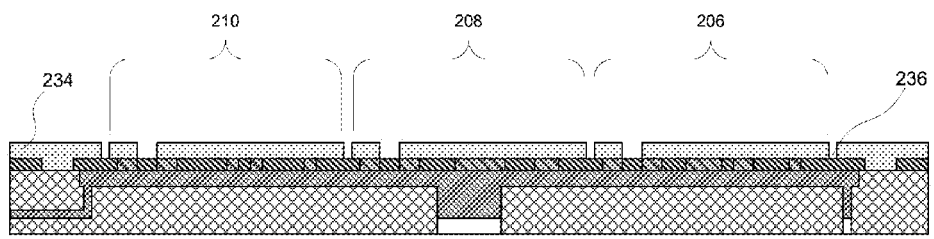
Figure 7J:
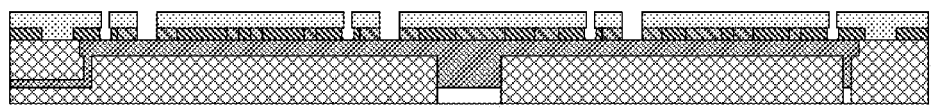
Figure 7K:
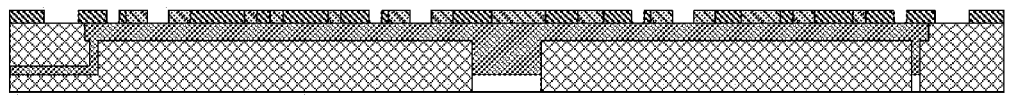
Figure 7L:
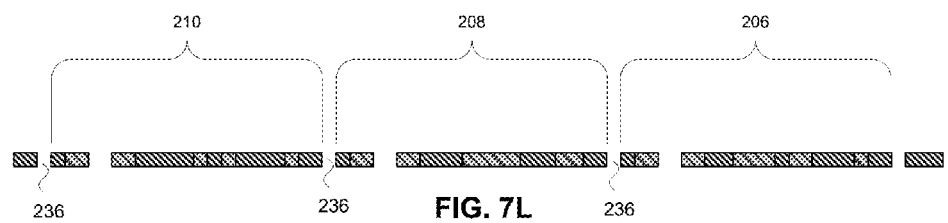
Figure 7M:
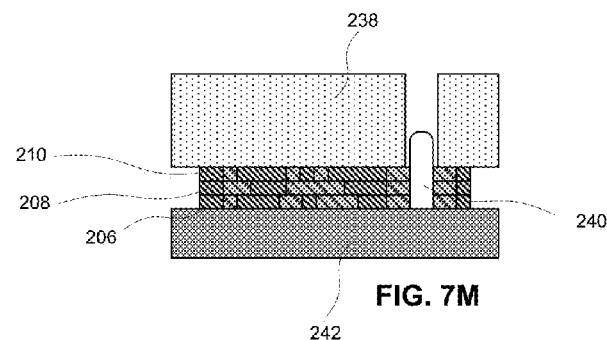
Figure 7N:
Figure 7O:

FIGS. 7A-7O depict, in cross section, a process flow of another embodiment. In FIG. 7A, a substrate 200 has been provided, and in FIG. 7B, a sacrificial material 202 has been deposited on it. In some embodiments, apertures 204 are provided in the sacrificial material 202 through which measurement probes can pass to access a reference surface 203 (e.g. in the form of the upper surface of the substrate) which may be used to measure the endpoint of planarization. In FIG. 7C, a single multi-material layer has been produced from structural material 214 and sacrificial material 202-1. In some embodiments the layer comprises multiple die (e.g. Die 1 206, Die 2 208, Die 3 210, etc.), three of which are shown in the figure. Also shown in cross section is a ring 212 of structural material 214 which is provided for purposes of alignment.

FIG. 7D shows a handle wafer 218 having a flat mating surface 226. The upper surface of the handle is preferably very parallel to the mating surface. The handle is provided with a recess 222, the purpose of which is to accommodate wax or other attachment material used to attach the handle to the layer. The area of the recess 222 is preferably smaller than the area of the layer, such that when the attachment material is confined to the recess a portion of the handle may be devoid of attachment material and may be used as a reference surface for planarization end-pointing (as can be seen in FIG. 7H). In some embodiments, the handle is no larger than the substrate, and the measurement probes access the reference surface on the handle through apertures in the sacrificial material (as can be seen in FIG. 7H). The handle is also provided with at least one fill hole 220 (not necessarily centered) that provides entry of attachment material, and (unless the mounting of the substrate to the handle wafer is performed in a vacuum) at least one vent hole, either venting to the top 216, or to the side 224 (so that the upper surface of the handle wafer is not interrupted, which may interfere with holding the handling wafer using a vacuum chuck), to allow release of air which may be trapped in the recess. In some embodiments support structures are provided within the recess to support the layer, especially if the attachment material isn't sufficiently stiff. In some embodiments, several smaller recesses are used in lieu of one large one. In some embodiments, the recess is shallow and/or the fill hole is small to minimize deformation of the attachment material when pressure is applied to the layer during planarization, which may distort layer thickness.

In FIG. 7E the mating surface 226 of the handle has been pressed against the surface of the layer with sufficient force 228 to provide intimate contact. In FIG. 7F, while the pressure is maintained, attachment material 230 such as wax has been introduced through the fill hole, displacing air from the recess and filling it, then allowed to set (e.g., harden if the material is a melted wax). In FIG. 7G, the substrate has been sawed or machined down so that only a thin portion of it remains. In FIG. 7H, the remainder of the substrate, the sacrificial material below the layer, and in some embodiments, a portion of the thickness of the layer has been removed (e.g., by single point diamond machining, CMP, or slurry- or fixed abrasive-based lapping) resulting in a layer of the desired thickness and parallelism. The final thickness and parallelism of the layer may be determined using one or more probes 232 that reference off one or more locations on the vacuum chuck surface 231 (as can be seen in FIG. 7G).

In FIG. 7I, photoresist 234 has been patterned over the layer so as to expose the centers of the rings and the borders 236 between die. The die borders show the locations of multiple die (e.g. Die 3 210, Die 2 208, Die 1 206, etc.), three of which are shown in the figure. In FIG. 7J the sacrificial material in the centers of the rings and in the die borders has been selectively etched out through apertures in the photoresist and in FIG. 7K the photoresist has been stripped.

In FIG. 7L, the individual die, now singulated by the etching step, have been released from the handle; the location of the three die are shown in the figure. In FIG. 7M, the die have been stacked in the desired order in a fixture which comprises an alignment pin 240 for every ring. The die are loaded into the fixture such that the pins pass through the rings, mechanically aligning them. The pins are preferably comparable in size with the inner dimension of the rings, providing accurate alignment of the die with respect to the pins and thus, with respect to one another. The fixture may include a base 242 and a weight 238 which presses on the stack with enough force to provide bring the die into intimate contact. In some embodiments, the die are subsequently diffusion bonded to one another, e.g., by heating according to a suitable time/temperature recipe in an inert or reducing gas. In some embodiments, the pins, the base, and/or the weight are made from, or coated with, where contacting the die, a material (e.g., ceramic, or an anodized film on aluminum) that cannot easily fuse to the die during bonding. In some embodiments the base is made largely from a material that is relatively closely matched in coefficient of thermal expansion with the die so that the distance between the pins and the rings change similarly with temperature. In FIG. 7N, the bonded die have been removed from the fixture. In FIG. 7O, the sacrificial material has been etched, producing a multi-layer device.

In some embodiments, variations similar to those mentioned with regard to FIGS. 5A-5P are utilized.

Figure 8G:
FIGS. 8A-8O depict, in cross section, a process flow of another embodiment.
Figure 8H:
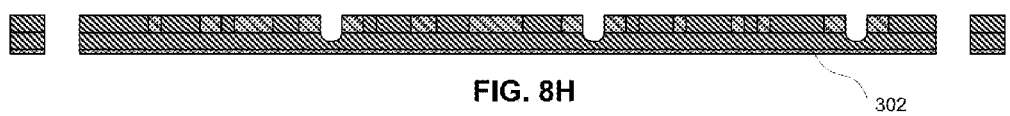
Figure 8I:
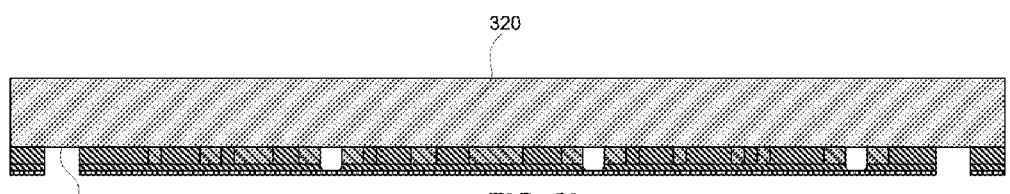
Figure 8J:
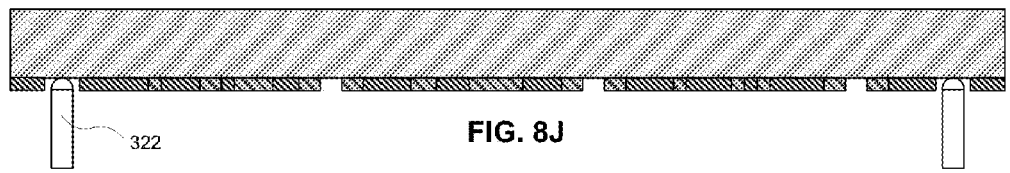
Figure 8K:
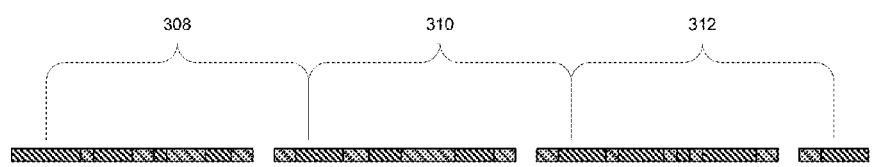
Figure 8L:
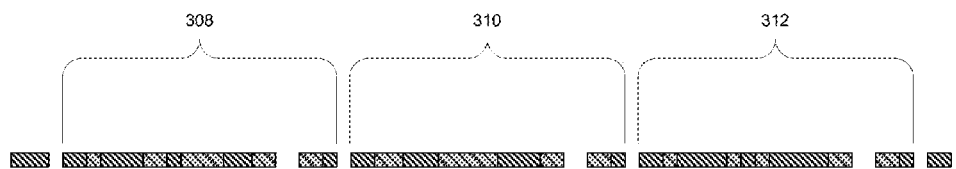
Figure 8M:
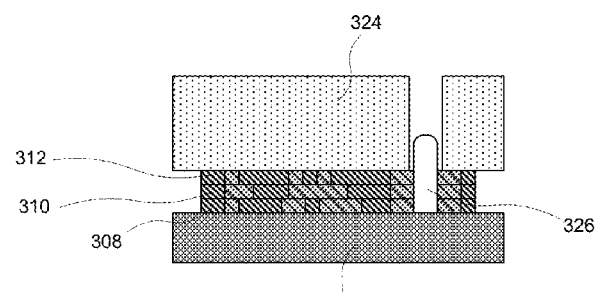
Figure 8N:
Figure 8O:

FIGS. 8A-8O depict, in cross section, a process flow of another embodiment. In FIG. 8A, a substrate 300 has been provided, and in FIG. 8B, a release material 302 (e.g., solder or other low melting point material, a secondary sacrificial metal that can be etched in a bath that minimally attacks the (primary) sacrificial material, a polymer having a metallized surface) has been deposited on it. In some embodiments, apertures 304 are provided in the release material through which measurement probes can pass to access the vacuum chuck used to measure the endpoint of planarization. In FIG. 8C, a sacrificial material 306 has been deposited on it. In some embodiments, apertures 304 are provided in the sacrificial material 306 through which measurement probes can pass to access the reference surface 305 used to measure the endpoint of planarization. In FIG. 8D, a single multi-material layer has been produced from structural material 316 and sacrificial material 306-1. In some embodiments the layer comprises multiple die (e.g. Die 1 308, Die 2 310, Die 3 312, etc.), three of which are shown in the figure. Also shown in cross section is a ring 314 of structural material 316 which is provided for purposes of alignment. In FIG. 8E photoresist 318 has been patterned over the layer so as to expose the centers of the rings. In FIG. 8F the sacrificial material in the centers of the rings been selectively etched out through apertures in the photoresist and in FIG. 8G the photoresist has been stripped.

In FIG. 8H, the substrate 300 has been removed by removing at least a portion of the release material 302 (e.g., by melting and/or etching). In some embodiments, residues of the release material may remain as shown, to be removed in a subsequent planarization step. In other embodiments, residues may be removed chemically, or by melting and wiping, squeegeeing, or wicking (e.g., using a solder wick material).

In FIG. 8I, the layer has been placed on a vacuum chuck 320. In FIG. 8J, any remaining release material and any remaining sacrificial material below the layer has been removed (e.g., by single point diamond machining, CMP, or slurry- or fixed abrasive-based lapping) and in some embodiments, a portion of the thickness of the layer has also been removed, resulting in a layer of the desired thickness and parallelism. The final thickness and parallelism of the layer may be determined using a probe 322 that references off the vacuum chuck surface 321 (as can be seen in FIG. 8I), serving as planarization end-pointing pads accessed through windows in the layer.

In FIG. 8K, the layer has been released from the vacuum chuck; the location of the three die are shown in the figure. In FIG. 8L, the die have been singulated (e.g., by cutting with scissors). In FIG. 8M, the die have been stacked in the desired order in a fixture which comprises an alignment pin 326 for every ring. The die are loaded into the fixture such that the pins pass through the rings, mechanically aligning them. The pins are preferably comparable in size with the inner dimension of the rings, providing accurate alignment of the die with respect to the pins and thus, with respect to one another. The fixture may include a base 328 and a weight 324 which presses on the stack with enough force to provide bring the die into intimate contact. In some embodiments, the die are subsequently diffusion bonded to one another, e.g., by heating according to a suitable time/temperature recipe in an inert or reducing gas. In some embodiments, the pins, the base, and/or the weight are made from, or coated with where contacting the die, a material (e.g., ceramic, or an anodized film on aluminum) that cannot easily fuse to the die during bonding. In some embodiments the base is made largely from a material that is relatively closely matched in coefficient of thermal expansion with the die so that the distance between the pins and the rings change similarly with temperature. In FIG. 8N, the bonded die have been removed from the fixture. In FIG. 8O, the sacrificial material has been etched, producing a multi-layer device.

In some embodiments, variations similar to those mentioned with regard to FIGS. 5A-5P are utilized.

Figure 9A:
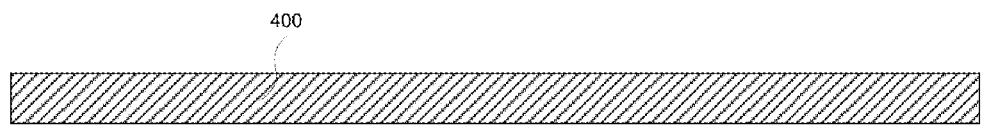
FIGS. 9A-9P depict in cross section a process flow of another embodiment.
Figure 9B:
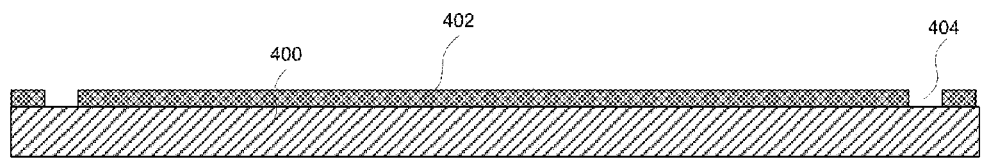
Figure 9C:
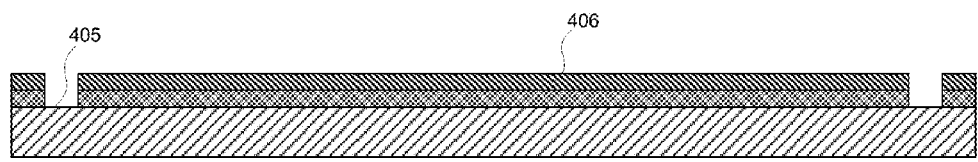
Figure 9D:
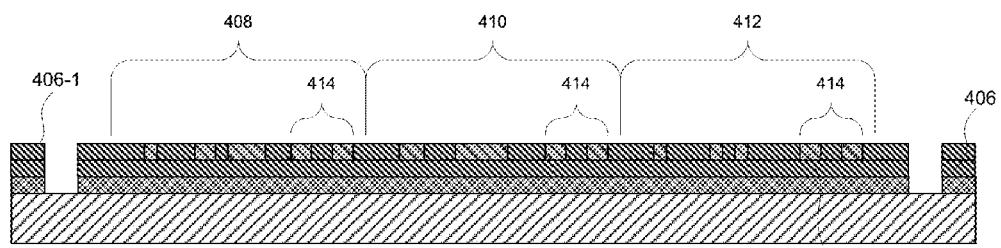
Figure 9E:
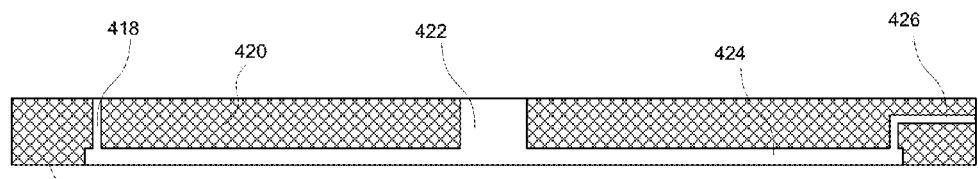
Figure 9F:
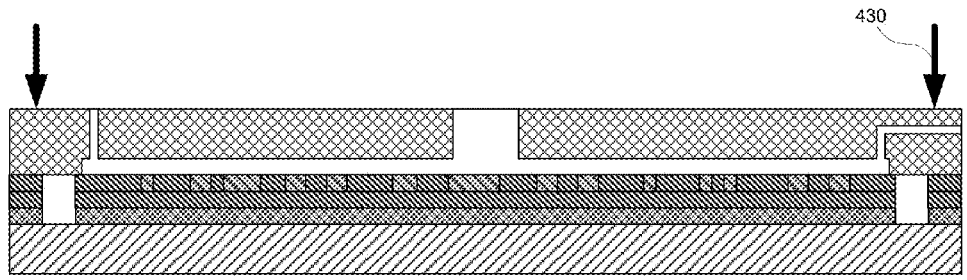
Figure 9G:
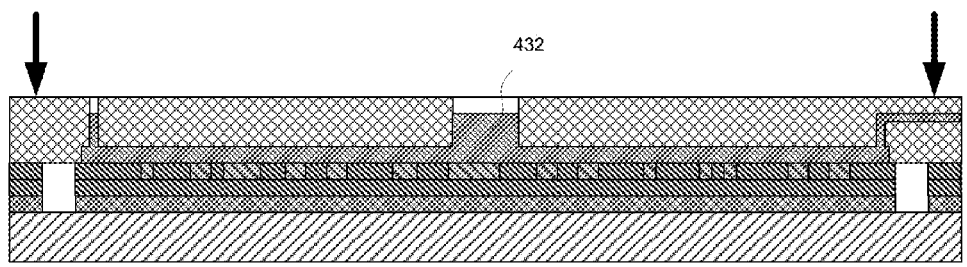
Figure 9H:
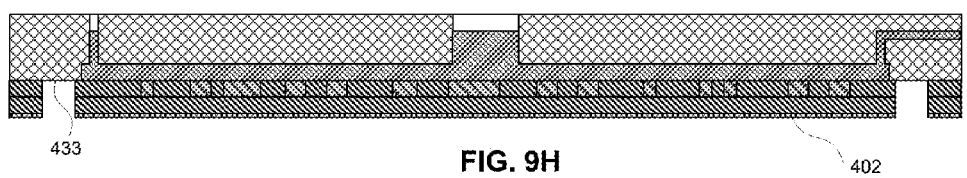
Figure 9I:
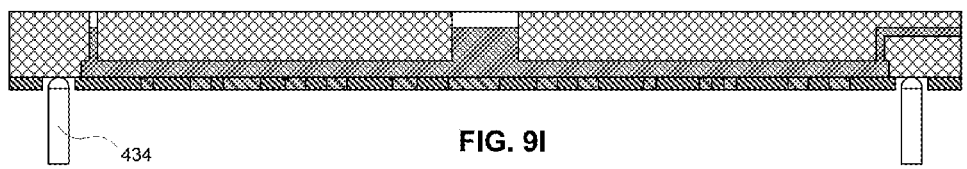
Figure 9J:
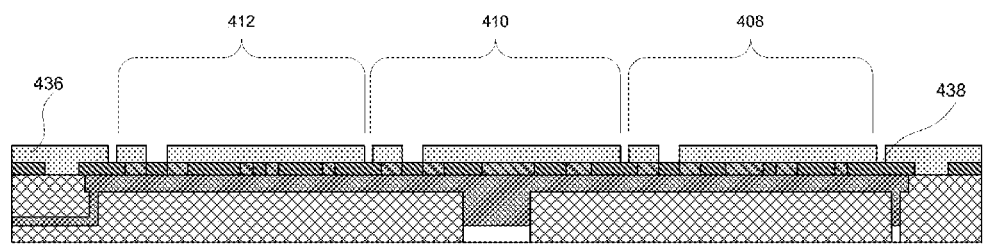
Figure 9K:
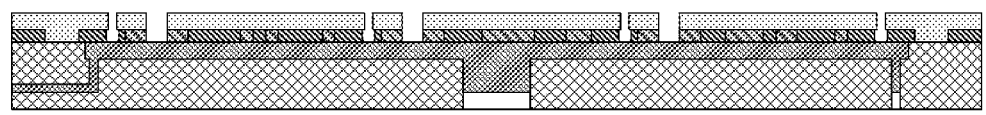
Figure 9L:
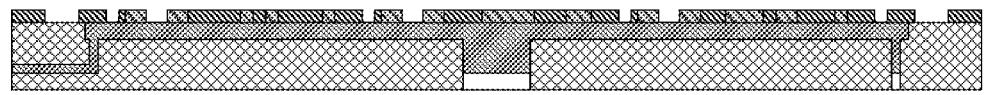
Figure 9M:
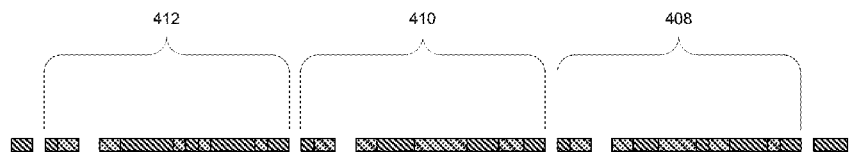
Figure 9N:
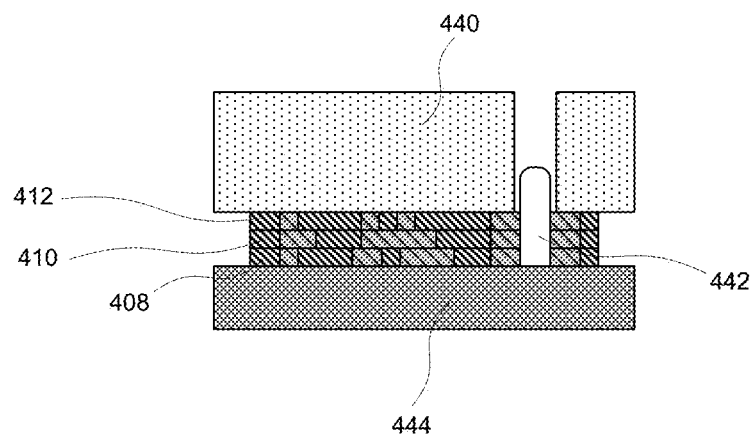
Figure 9O:
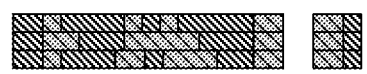
Figure 9P:

FIGS. 9A-9P depict in cross section a process flow of another embodiment. In FIG. 9A, a substrate 400 has been provided, and in FIG. 9B, a release material 402 (e.g., solder or other low melting point material, a secondary sacrificial metal that can be etched in a bath that minimally attacks the (primary) sacrificial material, a polymer having a metallized surface) has been deposited on it. In some embodiments, apertures 404 are provided in the release material through which measurement probes can pass to access the vacuum chuck used to measure the endpoint of planarization. In FIG. 9C, a sacrificial material 406 has been deposited on it. In some embodiments, apertures are provided in the sacrificial material through which measurement probes can pass to access the reference surface 405 used to measure the endpoint of planarization. In FIG. 9D, a single EFAB layer has been produced from structural material 416 and sacrificial material 406-1. In some embodiments the layer comprises multiple die (e.g. Die 1 408, Die 2 410, Die 3 412, etc.), three of which are shown in the figure. Also shown in cross section is a ring 414 of structural material which is provided for purposes of alignment.

FIG. 9E shows a handle wafer 420 having a flat mating surface 428. The upper surface of the handle is preferably very parallel to the mating surface. The handle is provided with a recess 424, the purpose of which is to accommodate wax or other attachment material used to attach the handle to the layer. The area of the recess is preferably smaller than the area of the layer, such that with the attachment material confined to the recess, a portion of the handle is devoid of attachment material and may be used as a reference surface for planarization end-pointing. In some embodiments, the handle is no larger than the substrate, and the measurement probes access the reference surface on the handle through apertures in the sacrificial material. The handle is also provided with at least one fill hole 422 (not necessarily centered) that provides entry of attachment material, and (unless the mounting of the substrate to the handle wafer is performed in a vacuum) at least one vent hole, either venting to the top 418, or to the side 426 (so that the upper surface of the handle wafer is not interrupted, which may interfere with holding the handling wafer using a vacuum chuck), to allow release of air which may be trapped in the recess. In some embodiments support structures are provided within the recess to support the layer, especially if the attachment material isn't sufficiently stiff. In some embodiments, several smaller recesses are used in lieu of one large one. In some embodiments, the recess is shallow and/or the fill hole is small to minimize deformation of the attachment material when pressure is applied to the layer during planarization, which may distort layer thickness.

In FIG. 9F the mating surface 428 of the handle has been pressed against the surface of the layer with sufficient force 430 to provide intimate contact. In FIG. 9G, while the pressure is maintained, attachment material 432 such as wax has been introduced through the fill hole, displacing air from the recess and filling it, then allowed to set (e.g., harden if the material is a melted wax). In FIG. 9H, the substrate has been removed by removing at least a portion of the release material 402 (e.g., by melting and/or etching). In some embodiments, residues of the release material may remain as shown, to be removed in a subsequent planarization step. In other embodiments, residues may be removed chemically, or by melting and wiping, squeegeeing, or wicking (e.g., using a solder wick material).

In FIG. 9I, any remaining release material and any remaining sacrificial material below the layer has been removed (e.g., by single point diamond machining, CMP, or slurry- or fixed abrasive-based lapping) and in some embodiments, a portion of the thickness of the layer has also been removed, resulting in a layer of the desired thickness and parallelism. The final thickness and parallelism of the layer may be determined using a probe 434 that references off the vacuum chuck surface 433 (as can be seen in FIG. 9H), serving as planarization end-pointing pads accessed through windows in the layer.

In FIG. 9J, photoresist 436 has been patterned over the layer so as to expose the centers of the rings and the borders 438 between die. In FIG. 9K the sacrificial material in the centers of the rings and in the die borders has been selectively etched out through apertures in the photoresist and in FIG. 9L the photoresist has been stripped. In FIG. 9M, the individual die, now singulated by the etching step, have been released from the handle; the location of the three die are shown in the figure.

In FIG. 9N, the die have been stacked in the desired order in a fixture which comprises an alignment pin 442 for every ring. The die are loaded into the fixture such that the pins pass through the rings, mechanically aligning them. The pins are preferably comparable in size with the inner dimension of the rings, providing accurate alignment of the die with respect to the pins and thus, with respect to one another. The fixture may include a base 444 and a weight 440 which presses on the stack with enough force to bring the die into intimate contact. In some embodiments, the die are subsequently diffusion bonded to one another, e.g., by heating according to a suitable time/temperature recipe in an inert or reducing gas. In some embodiments, the pins, the base, and/or the weight are made from, or coated with, where contacting the die, a material (e.g., ceramic, or an anodized film on aluminum) that cannot easily fuse to the die during bonding. In some embodiments the base is made largely from a material that is relatively closely matched in coefficient of thermal expansion with the die so that the distance between the pins and the rings change similarly with temperature. In FIG. 9O, the bonded die have been removed from the fixture. In FIG. 9P, the sacrificial material has been etched, producing a multi-layer device.

In some embodiments, variations similar to those mentioned with regard to FIGS. 5A-5P are utilized.

In some embodiments (e.g. alternatives to the embodiments of FIGS. 5A-9O), the individual die may comprise multiple layers in lieu of the single layers described above. For example, a thin layer, if otherwise too fragile to allow handling, may be fabricated along with at least one other layer according to conventional multi-layer, multi-material fabrication methods. In another example, since the interlayer alignment between layers normally achieved using such processing may be better than that achievable with the mechanical alignment described above, groups of layers for which the alignment is critical may be co-fabricated together using such processing, to benefit from the improved alignment.

In some embodiments (e.g. alternatives to the embodiments of FIGS. 5A-9O), a relatively thin substrate may be used for fabrication of the die since the total stress imposed on the substrate by the low number of layers is relatively small. In such cases, sawing of the substrate may be avoided.

In some embodiments (e.g. alternatives to the embodiments of FIGS. 5A-9O), the structural material may not be substantially co-planar with the sacrificial material, but rather, protrude slightly above it, either on the top surface of the die, the bottom surface, or both. Such protrusion may facilitate structural-structural material bonding by increasing the contact pressure between regions of structural material on adjacent layers. Such protrusion may also provide narrow gaps between regions of sacrificial material on adjacent layers, enhancing the flow of sacrificial material etchant during the final etch step, or provide pathways for exchange of gasses during a bonding process (e.g., allowing a forming gas to move easily reach regions of structural material, or allowing contaminants to more easily escape during bonding). Protrusion of structural material can be achieved by a controlled, short-term etch of the sacrificial material, a planarization or polishing process that causes recession of the sacrificial material with respect to the structural material (e.g., CMP with an appropriate slurry), etc. While it is desirable that structural material bond to structural material on adjacent die during the bonding process, in some embodiments, it is desirable that the sacrificial material not bond to sacrificial material or structural material on adjacent die (e.g., enhancing the flow of sacrificial material etchant during the final etch step, or provide pathways for exchange of gasses during a bonding process).

In some embodiments (e.g. alternatives to the embodiments of FIGS. 5A-9O), the temperatures at which diffusion bonding normally occurs are lowered to minimize the risk of compromising mechanical properties of the structural material; this may be done by increasing the bonding time and/or increasing the pressure to which the stack of die is subject during bonding and/or reducing the surface roughness of the die (e.g., through polishing processes performed on both sides of the die). In some embodiments, other methods of bonding (i.e. other than diffusion bonding) may be used. For example, a bonding material (e.g., a solder or a brazing material) may be applied to the bottom and/or top surface of each die to be bonded. Preferably, such material is applied selectively to the structural material features only, or in some embodiments, to those regions of structural material which overlap regions of structural material on adjacent layers (i.e., the Boolean intersection of the structural material on two adjacent layers). The time/temperature profile used to bond the die may in these cases be less than that required for diffusion bonding. Brazing material may be applied in solid, powder, or paste form (along with a binder) either non-selectively or selectively by such methods as stencil/screen printing, inkjet printing, and xerography, or by electrodeposition, PVD, or CVD.

In some embodiments (e.g. alternatives to the embodiments of FIGS. 5A-9O), materials which can be thermally processed without significant degradation of mechanical properties may be used. Such materials include nanoparticle dispersions in a metal matrix in which the dispersed phase remains distinct (e.g., particulate), minimally agglomerates, and minimally diffuses at the bonding temperature, serving to prevent grain growth at the bonding temperature and thus preserving desirable mechanical properties such as strength and hardness. In some embodiments, suitable materials comprise oxide dispersion-strengthened electrodeposited Ni and Ni alloys, which contain nanoscale particles co-deposited with the metal.

In some embodiments (e.g. alternatives to the embodiments of FIGS. 5A-9O), the die may be raised to a temperature that promotes adhesion but which, if normal cooling were allowed, would lead to compromised material properties, but then quenched rapidly from that temperature to minimize grain growth. This can be performed after etching of sacrificial material if the difference in coefficient of thermal expansion between sacrificial and structural material is not unacceptably large. In some embodiments, the bonded multilayer device after etching of sacrificial material may be hardened and strengthened—either just near its surfaces or throughout—by use of methods such as heat treating, tempering, carbonitriding, nitriding, nitrocarburizing, carburizing, flame hardening, laser heat treating, rapid thermal processing, boronizing, cyaniding, ion implantation (e.g., boron implantation of Ni—Ti), plasma nitriding, surface hardening, precipitation hardening, and laser surface melting.

In some embodiments (e.g. alternatives to the embodiments of FIGS. 5A-9O), a material may be deposited on the structural material (and in some embodiments also on the sacrificial material), which may be selected to form an intermetallic compound with the structural material, or to interdiffuse, during the bonding process. In some embodiments, the material may disappear from the interface between die after processing is completed. The intermetallic compound may provide enhanced strength of adhesion between adjacent layers than would be provided by a typical bonding material having a low melting temperature. For example, if tin is selectively deposited (e.g. by electrodeposition), preferably in a thin layer (e.g., 1-3 µm), onto structural material comprising Ni—Co alloy and preferably only in regions of overlap of structural material on adjacent layers, then the intermetallic formed at the junction during bonding at relatively low temperature can have good strength. An added benefit of the thin layer of tin is, due to its softness, the ability to help fill any gaps (e.g., due to surface irregularities) between overlapping regions of structural material on adjacent layers. Other materials that may form suitable intermetallics with Ni—Co may be used. When bonding palladium, suitable intermetallics may include gold and tin. If it is desirable that structural material protrude slightly beyond sacrificial material in at least these regions of overlap, the extra thickness associated with the tin (or other intermetallic compound-forming material) can provide this without the need for a process to make the sacrificial material preferentially recede.

In some embodiments (e.g. alternatives to the embodiments of FIGS. 5A-9O), the die may be bonded through a thin film of material such as silver having a lower melting point than the structural material of the die. Such a method is known to the art of bonding. One or both sides of the structural material may be coated with silver. A method for preparing a die in which both sides of the structural material are coated with silver to assist with bonding may include, for example, the following steps:

(1) Pattern a photoresist over a desired surface to create apertures for plating structural material;

(2) Pattern plate thin silver (this puts silver on the bottom surface of the die);

(3) Pattern plate structural material (e.g. nickel, a nickel alloy, palladium, platinum, or the like) to at least the full thickness of desired layer;

(4) Strip resist;

(5) Blanket plate a sacrificial material (e.g. copper)

(6) Planarize;

Pattern resist to create apertures over the structural material (possibly in a region slightly smaller than the structural material using a different mask, to allow for misalignment);

Pattern plate thin silver (this puts silver on the top surface of structural material of the die);

An issue with using silver or other soft/low-strength materials to bond layers together is that the interlayer adhesion is lower in shear than in tension. Several methods may be used to enhance interlayer adhesion when using silver or other materials.

After placing one die over another and optionally, after bonding, layers can be embossed to create undulations so that shear forces parallel to the layers are not completely parallel to the interlayer interface.

Co-depositing with the silver nanotubes, nanoscale carbon fibers, or other small particulate that is not equiaxed (ideally fiber or plate-like in shape) such that the short axis is substantially perpendicular to the layers. The resulting composite material is then stronger in the plane of the film than pure silver.

Creating grooves in the mating die surfaces that are slightly tapered and sliding the two surfaces together so that the grooves wedge together.

Forming an array of small (5-15 microns) or very small (1-5 microns) posts and holes in the structural material such that the posts of one die can fit into the holes of an adjacent die (adjacent in terms of stacking). The sizes may be such that the posts can easily fit into the holes. Additional lithography and deposition and/or etching steps are required for this approach. Preferably the height of the posts and the depth of the holes should be several times the thickness of the silver so that a large fraction of the silver is in compression or tension and not in shear. Preferably, the posts and holes are located only in areas of overlap between structural material on adjacent layers, so that they are not present on the up- or down-facing surfaces of the device, and are located so as not to intersect the edges of structural material features, so that they do not disrupt those edges. In some embodiments, in lieu of an array of small posts, a single, large protrusion (and corresponding recess in the adjacent layer) that matches the shape of the intersection between layers, but is offset inwards away from the edge may be used. Compared with arrays of posts, this approach may provide easier alignment and better adhesion in shear. Such a post and hole approach may be used in conjunction with the other embodiments set forth herein as well to provide some interlacing of layers.

Strengthening the silver (e.g., through precipitation hardening).

In some embodiments (e.g. in addition to or as alternatives to the bonding processes of embodiments of FIGS. 5A-9O or in conjunction with one or more of the other alternatives presented herein), the die may be bonded by the use of ultrasonic energy which may be combined with pressure and/or heating. For example, ultrasonic welding (Sonobond Ultrasonics, West Chester, Pa.), ultrasonic consolidation (Solidica, Ann Arbor, Mich.), thermosonic bonding (used for example for wire bonding in integrated circuit packaging), or other forms of welding such as resistance welding may be used to bond a die to the die directly beneath it, or potentially bond multiple die at once. It is important that ultrasonic bonding not cause an unacceptable level of misalignment of one die with respect to another due to the displacement of the material during the bonding process; ultrasonic approaches in which the motion is perpendicular to the die surface may therefore be preferred. In some variations, such bonding may be performed after stacking of each die layer or after stacking a subset of the die layers which can be followed by subsequent stacking and bonding.

Figure 10A:
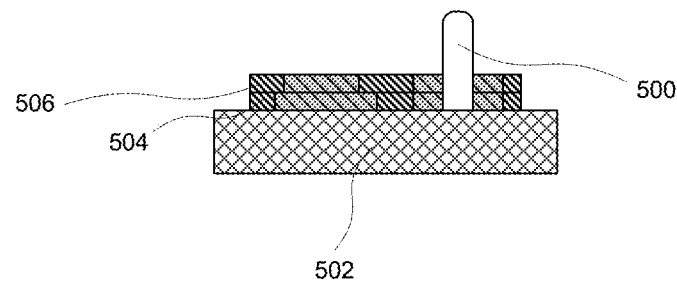
FIGS. 10A-10C depict in cross section a process flow for bonding die using laser welding.
Figure 10B:
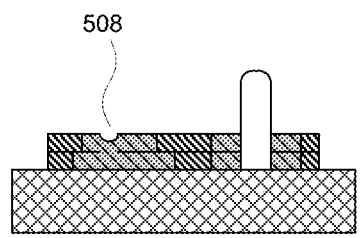
Figure 10C:
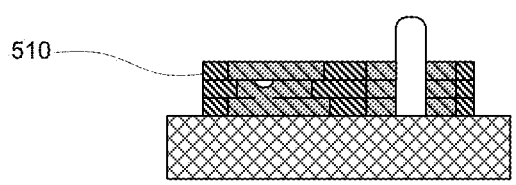

In some embodiments (e.g. in addition to or as alternatives to the bonding processes of embodiments of FIGS. 5A-9O or in conjunction with one or more of the other alternatives presented herein), laser welding may be used to bond stacked die together, one (or a few) die at a time. The laser bonds may not fill the entire region of overlap between structural material on adjacent layers, but may be more of the form of localized tack or seam welds. In some embodiments welding is performed in the order of stacking the die, while in other embodiments it is performed on groups of die which are then bonded together. In some embodiments, only regions where structural material overlaps with the previous layer are welded, while in other embodiments, regions of overlap between sacrificial material and sacrificial material, and/or sacrificial material and structural material are also welded. In some embodiments, the welding exposure may be varied as a function of which type of material is being welded to which, and based on thicknesses of material. In some embodiments, material distortions such as sink marks associated with laser welding may be hidden (e.g., for cosmetic reasons) in many locations by strategic placement of the weld points. For example, in FIGS. 10A-10C, which depicts in cross section a process flow for bonding die using laser welding, sink marks in Die 2 506 (FIG. 10B) are hidden below structural features of overlying Die 3 510 (FIG. 10C). In FIG. 10A, two die are stacked on a base 502 using an alignment pin or pin(s) 500 and in FIG. 10B, a laser has locally welded a region of structural material in Die 2 506 to an underlying region of structural material in Die 1 504, producing a sink mark 508. In FIG. 10C, a structural feature of Die 3 510 overlies the sink mark on Die 2 506, hiding the defect. In some embodiments, welds may be produced in the same operation between more than a pair of die. For example, a laser weld may be formed with a relatively low exposure in a region where only two adjacent die must be welded, while laser welds formed in areas where material on three successive die overlaps may be formed with a relatively higher exposure, to provide extra penetration. In some embodiments, apertures formed in a die (e.g., by etching) may provide access to regions of die lower in the stack that can be welded in the same operation as regions of die that are higher in the stack.

In some embodiments (e.g. in addition to or as alternatives to the bonding processes of embodiments of FIGS. 5A-9O or in conjunction with one or more of the other alternatives presented herein), a bonding material may be used which is activated catalytically by the structural material (e.g., palladium or nickel alloy) or by the sacrificial material.

In some embodiments (e.g. in addition to or as alternatives to the bonding processes of embodiments of FIGS. 5A-9O or in conjunction with one or more of the other alternatives presented herein), hot or cold isostatic pressing of the die stack may be used to bond or help bond the die to one another. In some embodiments (e.g. in addition to or as alternatives to the bonding processes of embodiments of FIGS. 5A-9O or in conjunction with one or more of the other alternatives presented herein), the die may be surrounded by an inert gas or a forming gas during the pressing operation. In some embodiments (e.g. in addition to or as alternatives to the bonding processes of embodiments of FIGS. 5A-9O or in conjunction with one or more of the other alternatives presented herein), in lieu of isostatic pressing, uniaxial pressing along the layer-stacking axis (Z) may be used.

In some embodiments (e.g. as exemplified in the embodiments of FIGS. 5A-9O), all the die needed to form a device or group of devices are formed within a single multi-material layer, patterned by a single photomask. However, in other embodiments, more than one multi-material layer may be used. For example, when layers of varying thickness are required to produce the device, more than one multi-material layer (and more than one mask) may be used; the die derived from these layers may then be stacked in an appropriate order and bonded one at a time, in subgroups, or only after all layers have been stacked. As another example, where multiple die are to be bonded in different stacks without separating the die from one another first, die from different multi-material layers may be stacked and bonded. As another example, when different layers are to be formed in whole or in part from different materials, different multi-materials layers may be formed and then stacked and bonded.

In some embodiments, die may include human or machine-readable sequence numbers (e.g., in a corner) so that after singulation, they are easily stacked in the correct order. In some embodiments, die may be stacked in reversed orientations (e.g. one die may be stacked with it top formation side facing upward while another die for the same part may be stacked with its top formation side facing downward).

In some embodiments, in lieu of a weight, pressure may be applied to the stacked die during bonding via a hydraulic or pneumatic ram. In some embodiments, release of sacrificial material may occur before stacking, after stacking but before bonding, or only after bonding is complete for two layers, for more than two layers but less than all layers, or for all layers.

Die which are singulated mechanically (e.g., using shears, a razor blade, a dicing saw, etc.) may have edges that include burrs or other distortions which may prevent intimate contact of adjacent die. In some embodiments, such edge artifacts may be removed by individually etching a 'margin' area from the edges (e.g., by dipping them into an etchant). In some embodiments, edge artifacts may be removed after stacking the die, e.g., by dipping the edge of the stack into an etchant. However, care may be required to prevent etchant from wicking into the gaps between die and reaching areas of the die that should not be etched prematurely or contaminated.

In some embodiments, measurement of the height of the die stack obtained once all die are stacked, or as each die is added to the stack, can be used to detect problems with the stack. Assuming that, ignoring edge distortions, the thickness of the individual die is known (e.g., by in-process measurements such as that shown in FIG. 5K, or by individual measurement before or after singulation), measurement of the total thickness can indicate problems such as edge distortions, particles trapped between die, and wrinkles in the die.

Figure 11:
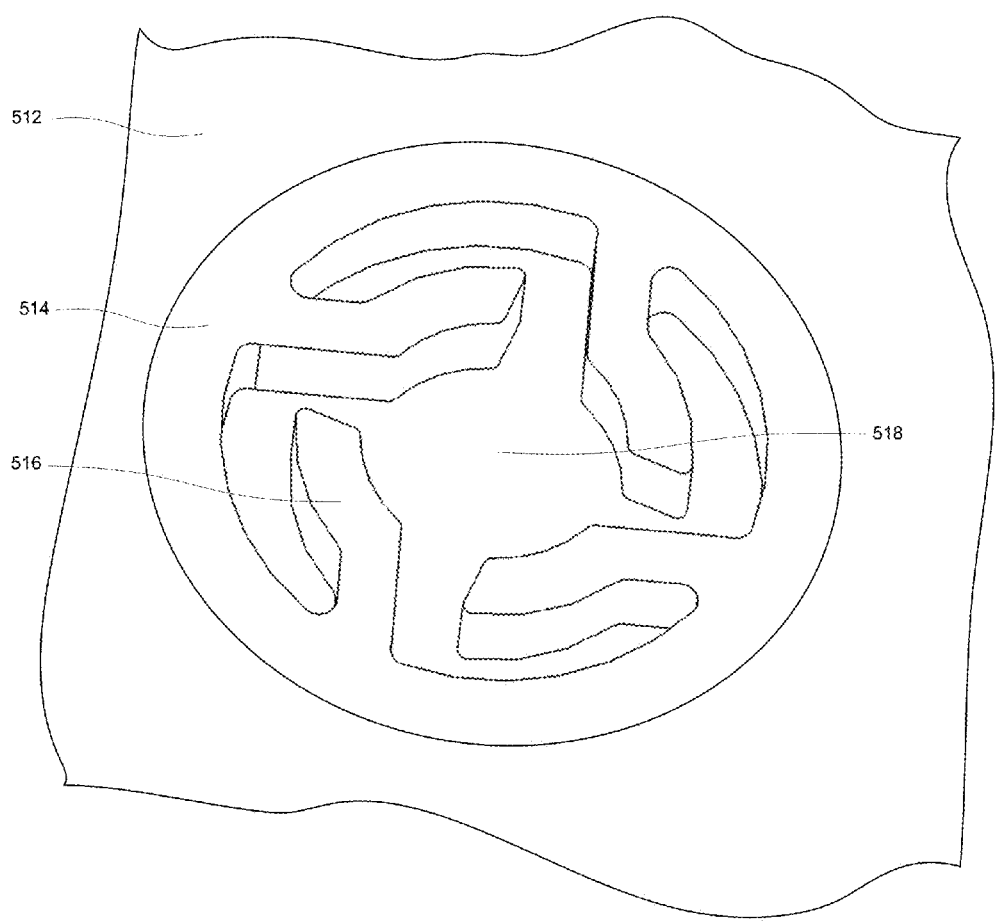
FIG. 11 depicts a ring element which is formed of structural material from which sacrificial material has been removed from the interior region but remains around the exterior of the ring.
Figure 12:
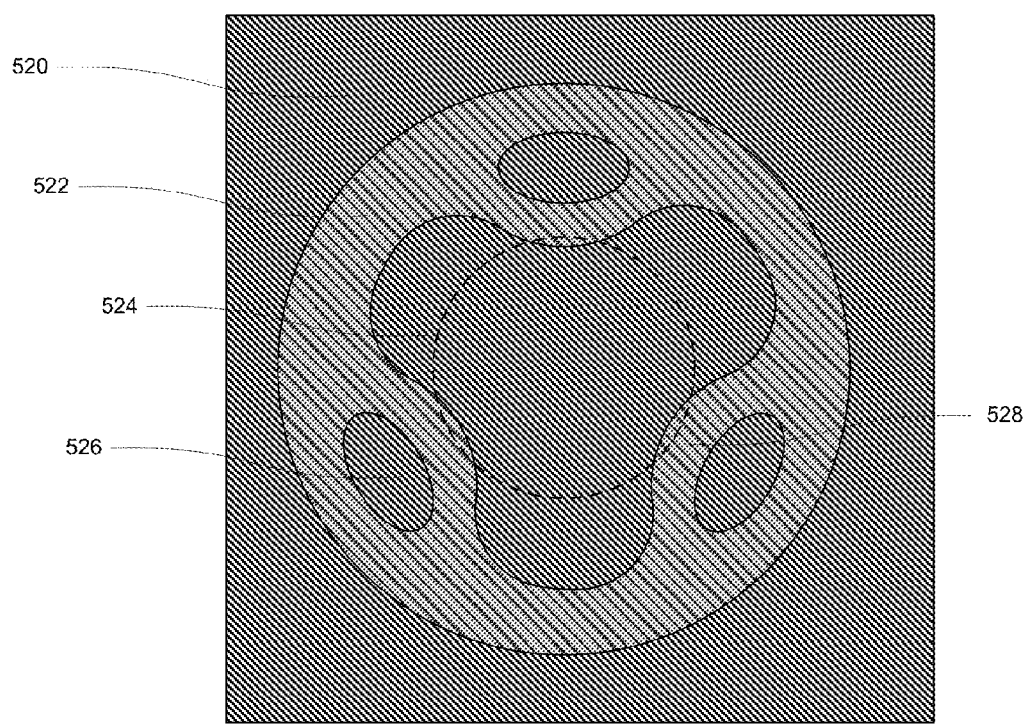
FIG. 12 depicts a ring element formed of structural material having flexures, relief holes and a central hole region capable of receiving a pin.
Figure 13A:
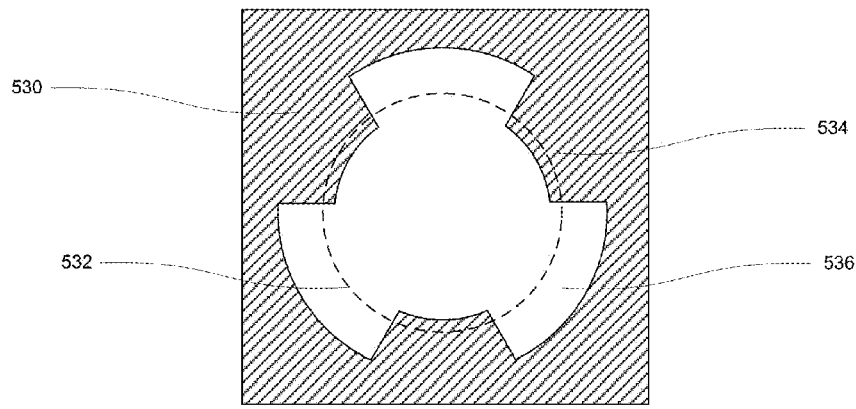
FIGS. 13A-13C, another example of alternative ring structures is provided.
Figure 13B:
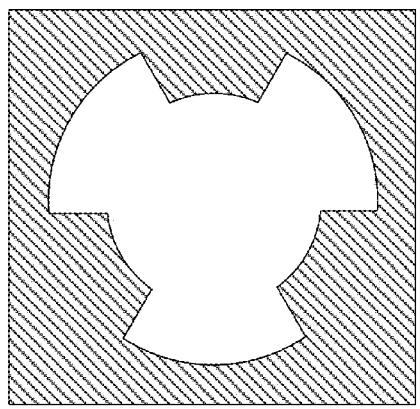
Figure 13C:
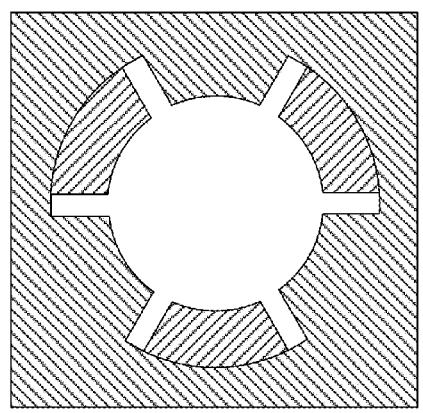

In some embodiments, rings may be designed to fit tightly over the pins with little or no clearance, to ensure more accurate alignment of the die. Unlike holes drilled in laminations that are stacked in conventional diffusion bonding, rings and other alignment features produced using EFAB can be more sophisticated and provide greatly-improved alignment, for example, through the use of compliant elements. For example, in some embodiments the rings may be split or otherwise made compliant to allow a small amount of aperture expansion when the pin is inserted, or include compliant features such as the in-plane flexures 516 shown in FIG. 11 or in plane flexures 528 shown in FIG. 12. As shown in FIG. 11 the ring element is formed of structural material 514 from which sacrificial material 512 has been removed from the interior region but remains around the exterior of the ring. The ring includes flexures 516 which define an insertion hole 518 which is somewhat smaller in diameter than a pin which is to be inserted but which can expand elastically to allow insertion while still providing a centering or optimal pin positioning effect. In some variations of this embodiment, previously or subsequently formed layers may provide additional flexures (to provide greater restoration or spring force) or openings (to allow freedom for flexures to elastically deflect). As shown in FIG. 12 a ring element is formed of structural material 522 having flexures 528, relief holes 526, and a central hole region capable of receiving a pin having outline 524. As shown in FIG. 12 sacrificial material 520 remains not only around the exterior of the ring but also fills the interior portion. Such interior sacrificial material will need to be selectively removed prior to the ring being able to accept an alignment pin. The relief hole 526 behind each flexure 528 allows outward motion (e.g. via downward flexing) to allow expansion for pin insertion. In FIGS. 13A-13C, another example of alternative ring structures is provided. In FIG. 13A the rings formed of structural material 530 have the form of holes with leaves 534 (preferably at least 3) that protrude inwards, the inner edges of the leaves forming a hole having a smaller diameter, preferably slightly smaller (while the leaves remain flat) than the diameter (shown with pin outline 532) of an alignment pin that is to be used. When such a ring is placed over the pin, the leaves will deflect upwards slightly to accommodate the pin, forming a tight fit around it. The rings on a subsequent die, e.g. alternating die (odd and even numbered), are different. FIG. 13A shows the ring, for example, for odd-numbered die. To accommodate the out-of-plane deflection of the leaves, the rings for even-number die may be rotated with respect to those for odd-number die (e.g., FIG. 13B), such that the deflected leaves can fit into the gaps 536 between leaves on the next-higher die when both are stacked on the pin as illustrated in FIG. 13C (the pin is not shown). In the case of grouped die, in some embodiments all die in the group are provided with alignment features, while in other embodiments only some are. In some embodiments, an alignment ring such as that in FIG. 13A may be provided on at least one die of a group, with the die just above this die in the stack having a cavity to accommodate the deflected leaves; in this case, there may be no need to alternate between odd and even versions of the alignment rings since alignment for different layers may be achieved by different alignment guides in different positions. In addition to the circular versions shown, elongated/racetrack versions of rings with the compliant features described above may be provided as well. Rings with leaves such as those of FIG. 13A-13C are particularly suitable for thin layers for which in-plane flexures are less suitable (e.g., if the flexures of FIG. 11 aren't reasonably tall for their width, they may deform undesirably and become non-functional).

In some embodiments, alignment is at least in part accomplished not using features within the die area, but using at least one edge of the die. For example, the die can be fabricated with a precise border of structural material such that if singulated by etching (e.g., as in FIG. 7J) the borders can serve as references for alignment. In some embodiments the border may be discontinuous (e.g. dashed) to allow differential thermal expansion of the sacrificial material with respect to the structural material without causing buckling or other distortion of the die. In other embodiments, the edge features may be associated with groups of die instead of individual die.

In some embodiments in lieu of mechanical alignment, optical alignment may be used to align one die to another. For example, the die may include rings of varying size such that Die 1 (at the bottom of the stack) has rings with the smaller inner diameter and Die T (where T is the uppermost layer) has rings with the larger inner diameter, with the inner diameter of all rings of intermediate layers monotonically increasing from 1 to T. Then it is possible to optically center the ring of Die n with respect to the ring of Die n−1 since the ring of Die n−1 is always visible within the ring of Die n. In some embodiments optical alignment may be used to align one die with another using a methods known to the art of wafer bonding (e.g., using optics to view alignment features on the surfaces of two die facing one another, aligning them and bringing the two surfaces together) or flip chip bonding (e.g., viewing features on the top surface of the previous die and on the bottom surface of the die to be bonded while the latter is inverted, aligning them, turning the inverted die right-side up in a highly repeatable fashion while bringing the two surfaces together). Once aligned to a previous layer (or a layer below the previous layer), typically one layer at a time, the die may be clamped, temporarily adhered, tack welded (e.g., laser tack welding in a few spots, preferably in a region of sacrificial material), etc. so that the alignment is maintained until all layers are aligned and bonded. Alternatively, the use of a fluid, such as a fluid that is driven off during the bonding process, between individual die, can help prevent the die from sliding relative to one another while being individually aligned and stacked. Possible fluids include water and various alcohols, as well as fluids whose presence enhances the bonding process. Since individual die may not be perfectly flat as-fabricated (e.g. due to residual stresses in deposited and planarized materials) they can be pressed flat, bent around a shaped form that leaves them flat after allowing for elastic spring-back, or heat-treated to relieve the stress and possibly anneal the material.

In some embodiments, rather than use alignment holes, the die are formed in a continuous group (such as a strip) that is folded (e.g., along perforations) to form the stack, such that the location of folding defines the alignment between die. If several die are arranged in a linear strip, in some embodiments the folding may be in a zigzag pattern and the pattern on odd or even die along the strip is reversed to pre-compensate for the direction of folding. Examples of such formation by folding are provided in previously referenced U.S. patent application Ser. No. 11/506,586.

Figure 14A:
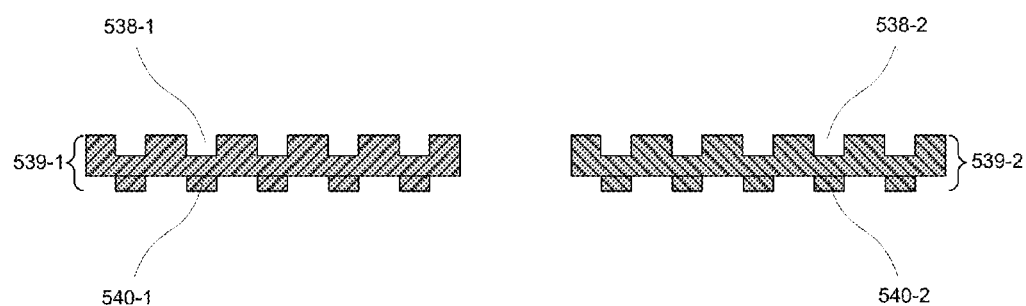
FIGS. 14-A & 14-B show die with blind holes
Figure 14B:
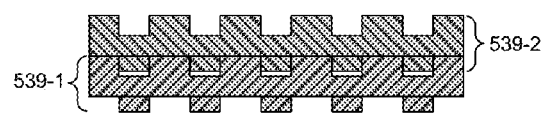
Figure 15A:
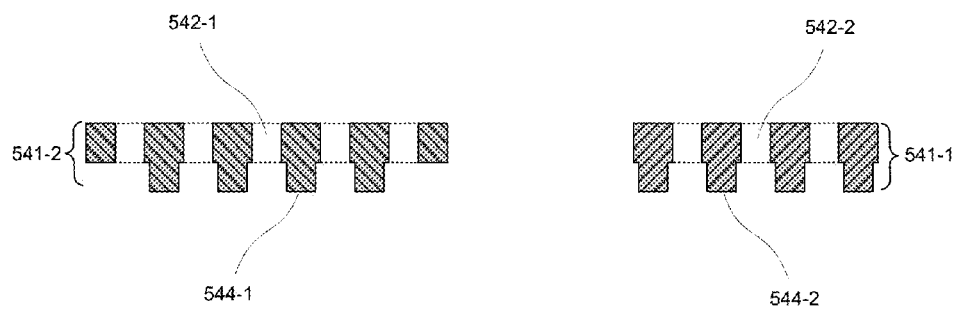
FIGS. 15A & 15B show die with through holes.
Figure 15B:
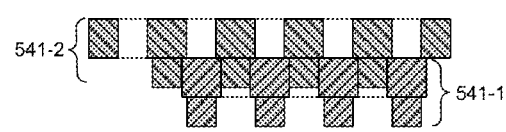

In some embodiments, die 539-1 & 539-2 (FIGS. 14A & 14B) and 541-1 & 541-2 (FIGS. 15A & 15B) are provided with bumps 540-1 & 540-2 (FIG. 14A) and 544-1 & 544-2 (FIG. 15A) and holes 538-1 & 538-2 (FIG. 14A) and 542-1 & 542-2 (FIG. 15A). FIGS. 14-A & 14-B show die with blind holes while FIGS. 15A & 15B show die with through holes. The bumps and holes are positioned on individual die so that when multiple die are stacked and aligned, the bumps from one die can enter into holes of the adjacent die. In some embodiments, the bumps and holes may be used entirely for alignment, while in other embodiments, coarse alignment is achieved using some other method (e.g., pin and rings as already described) and fine alignment achieved using bumps and holes. If through holes are used, then the bumps may be distributed in some way as to not entirely overlap the holes, so that the bumps have proper support. Through holes may be created as part of a normal multi-material layer, whereas blind holes may be produced as through holes on an additional (e.g., third) multi-material layer, or by a patterned etching process, for example. In some embodiments, the bottommost die may not have bumps on its bottom surface, and the topmost die may not have holes on its top surface. In some embodiments, the bumps and holes provide purely mechanical alignment of die, while in other embodiments, they enhance the bonding between die (e.g., by increasing surface or providing increased resistance to delamination in shear). In some embodiments, at least some of the bumps and holes are within the boundaries of a device to be fabricated, while in other embodiments, the bumps and holes are within separate structures used for alignment which are detached from the devices, but embedded in sacrificial material. In some embodiments, the bumps and holes can be distributed so as to avoid edges of features, using an appropriate distribution algorithm. For example, the bumps and holes may as a first step be distributed on a uniform grid, and as a second step, any bumps and holes which fall too close to a feature edge are deleted from the design. In some embodiments, in lieu of bumps and holes, larger features such as ledges within the boundaries of the device layer, occupying considerably more area than a bump or hole, may be used.

Figure 16A:
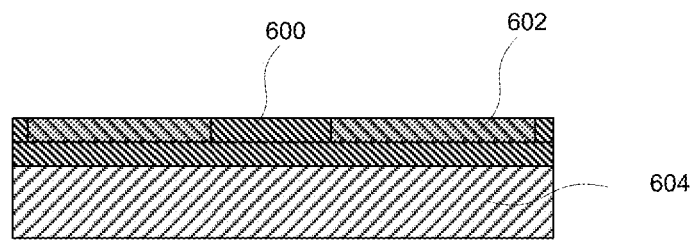
FIGS. 16A-16J depict a process for fabricating die with pins and holes and for joining the die together using pin deformation.
Figure 16B:
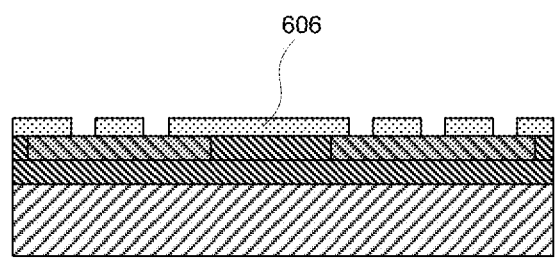
Figure 16C:
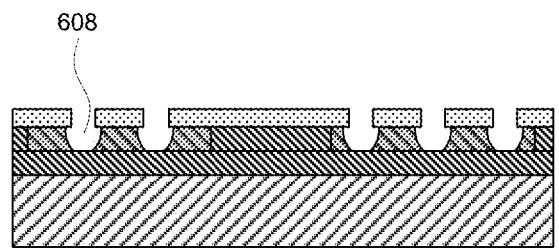
Figure 16D:
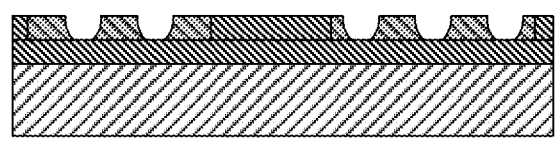
Figure 16E:
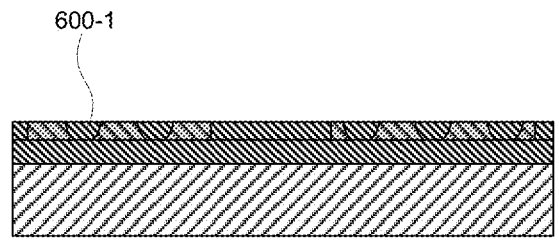
Figure 16F:
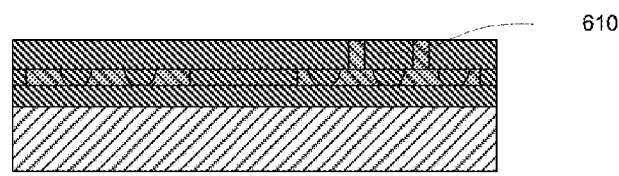
Figure 16G:
Figure 16H:
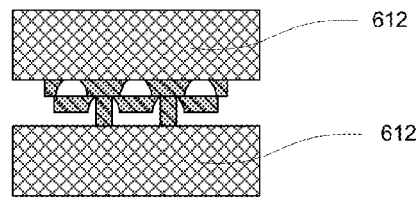
Figure 16I:
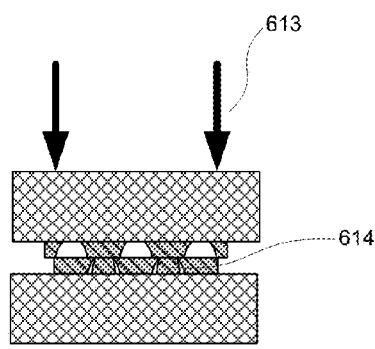
Figure 16J:

In some embodiments, attachment and alignment between die is achieved by the use of deformable or swageable pins, or rivets which deform into a blind or through hole in an adjacent die, interlocking the two die together. In some embodiments, the holes through which the pins enter have non-vertical sidewalls such that expansion of the pins on deformation causes strong interlocking of the die, while in other embodiments, the holes have substantially vertical sidewalls. FIG. 16A-16J depict a process for fabricating die with pins and holes and for joining the die together using pin deformation. In FIG. 16A, a layer of a die has been formed from structural material 602, over a layer of sacrificial material 600 on a substrate 604. In FIG. 16B, photoresist 606 has been patterned to define the holes to be made in the layer of structural material 602. In FIG. 16C, holes 608 having non-vertical sidewalls have been etched (e.g., through isotropic etching) in the layer. In FIG. 16D, the resist has been stripped and in FIG. 16E, sacrificial material 600-1 has been redeposited (to fill the holes) and the layer has been replanarized. In FIG. 16F, a layer has been fabricated which comprises pins 610. In some embodiments, the pins are composed of a different, more easily deformable structural material than the rest of the die. In FIG. 16G, the die have been released. In FIG. 16H, the die have been stacked such that the pins fit through the holes, and the die have been placed between two blocks 612. In some embodiments, alignment pins may be used to guide the stacking operation. In some embodiments the volume of each hole exceeds that of the pin inserted into it, while in other embodiments the volumes are the same. In some embodiments the fit is relatively loose, facilitating stacking, while in other embodiments the fit is fairly tight, providing at least a portion of the inter-die alignment. In FIG. 16I, pressure 613 applied to the die through the blocks 612 (e.g., using an arbor or hydraulic press) has deformed the pins 614. In some embodiments, the die may shift parallel to the layer plane with respect to one another as the pins deform and fill more of the hole volume, improving the alignment between die. In FIG. 16J, the die have been removed from the blocks and now form a unit.

In some embodiments, the pins and holes provide purely mechanical alignment between die, while in other embodiments, they enhance the bonding between die. In some embodiments, pressure alone is used to connect die with one another as is shown in the process of FIGS. 16A-16J, while in other embodiments, heat (e.g., diffusion bonding) is also used. In some embodiments, in lieu of etching to create holes with non-vertical sidewalls, the holes are formed by the non-vertical sidewalls in the photoresist during the electroplating of the layer. Non-vertical sidewalls may be achieved by suitable choice of photoresist or resist processing conditions, use of grey-scale lithography, etc.

In some embodiments, bonding between adjacent die may be accomplished using solder or similar meltable material which is applied to the interface between die, with solder mask applied on both sides of the die (except for top and bottom die) in regions other than the regions of structural material overlap between adjacent die (i.e., the Boolean intersection of structural material on adjacent die). If the solder is thick enough, then upon reflow of the solder may serve to self-align each die to the adjacent die using surface tension. If pressure on the die stack is required to achieve good bonding, this may be applied after the reflow has been performed.

Figure 17A:
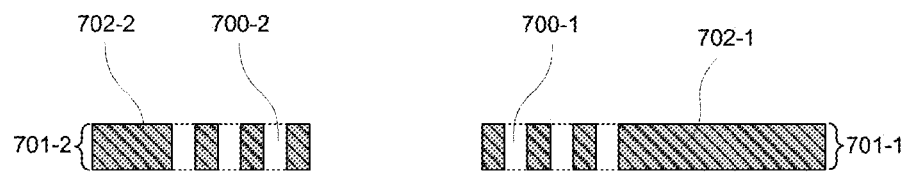
FIG. 17A-17C depict a process for joining two die by stacking and filling holes with a filler material.
Figure 17B:
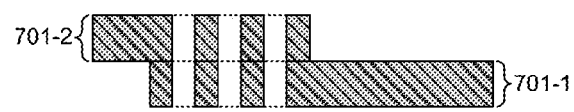
Figure 17C:
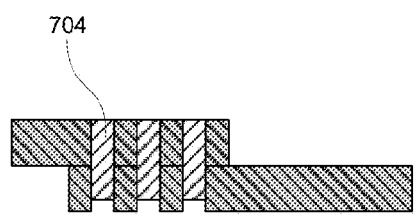

In some embodiments, small holes may be provided in die such that when the die are stacked in reasonable alignment, the holes form continuous passages through at least two adjacent die. Such holes may be used for alignment (e.g., through the insertion of small pins) and attachment of the die, e.g., through the insertion of small pins, or filling the holes with a material that is solid or solidifiable. In FIG. 17A, two die 701-1 and 701-2 are shown formed of structural material 702-1 and 702-2 with holes 700-1 and 700-2. In FIG. 17B, the die have been stacked in alignment. In FIG. 17C, a filler 704 has been applied to the holes. The filler 704 may be a metal that is electrodeposited into the holes, effectively welding adjacent die together, a molten material which cools and solidifies, an adhesive which is cured, etc.

In some embodiments the structural material is initially an unpatterned continuous film or sheet that is patterned either prior to introduction into the layer fabrication process or afterwards. Patterning may be achieved by such methods as chemical milling/photochemical machining, laser machining, electrical discharge machining, stamping or fineblanking, and waterjet cutting. Use of a sheet allows use of a wider range of structural materials, for example, metals which are hardenable after bonding such as steels, metals which can tolerate high-temperature bonding without weaking significantly, and difficult or impossible to electrodeposit metals such as titanium or cobalt-chromium. In addition, greater thicknesses of material may be used than might be practical to deposit, and the material may have very low residual stress.

Figure 18A:
FIGS. 18A-18N depict in cross section a process flow of another embodiment wherein a sheet of structural material is used.
Figure 18B:
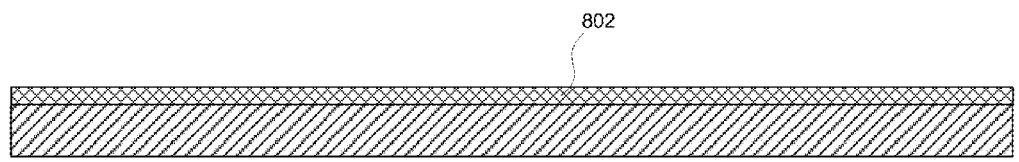
Figure 18C:
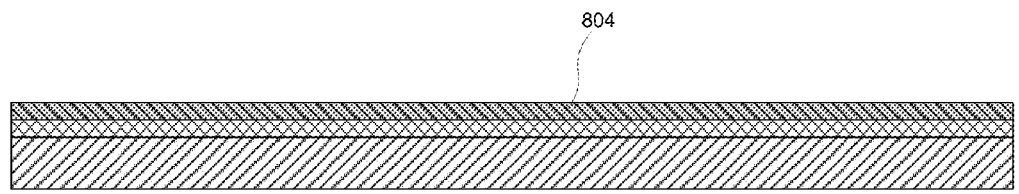
Figure 18D:
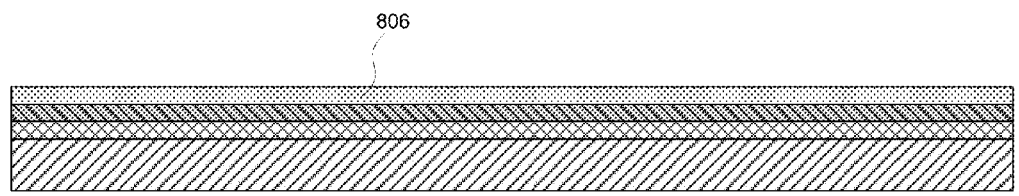
Figure 18E:
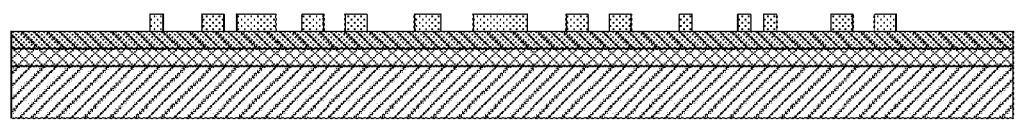
Figure 18F:
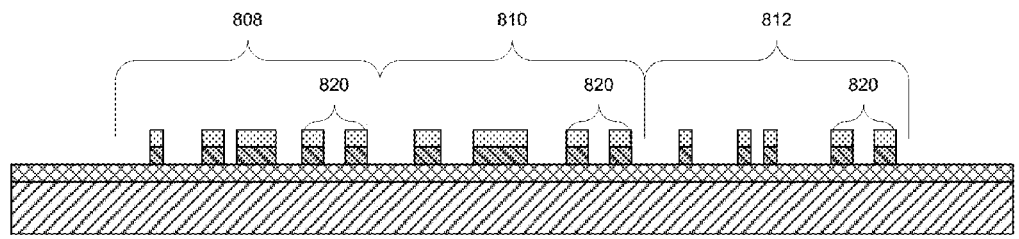
Figure 18G:
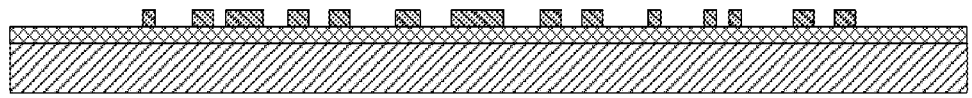
Figure 18H:
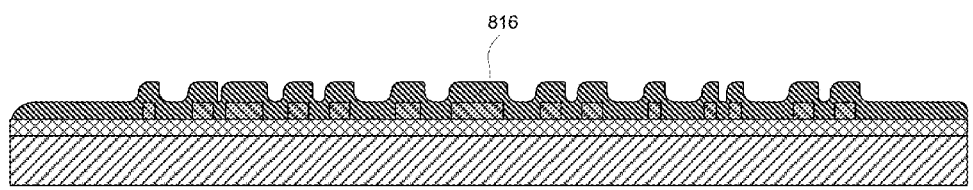
Figure 18I:
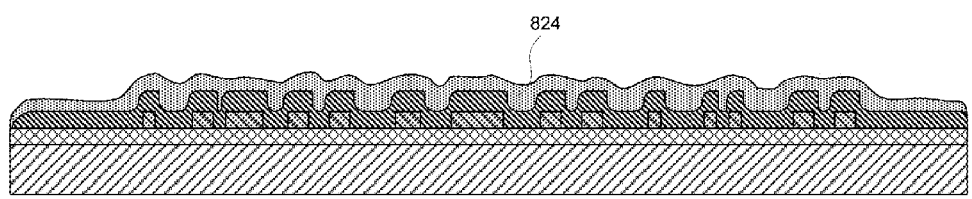
Figure 18J:
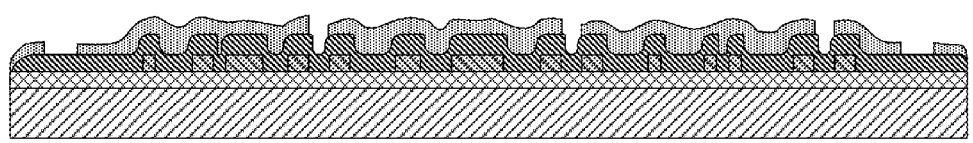
Figure 18K:
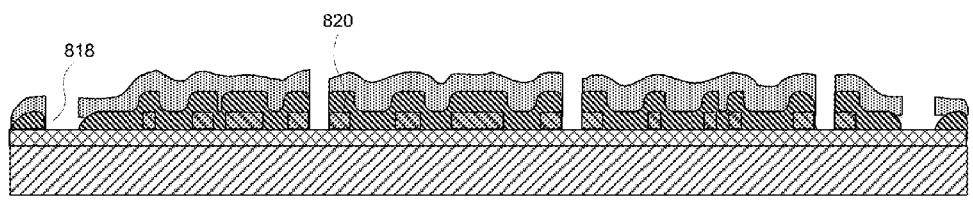
Figure 18L:
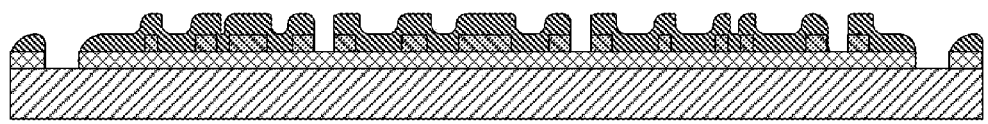
Figure 18M:
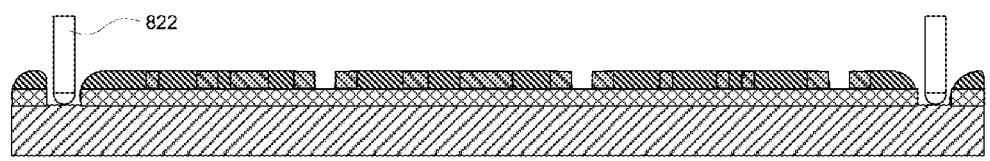
Figure 18N:
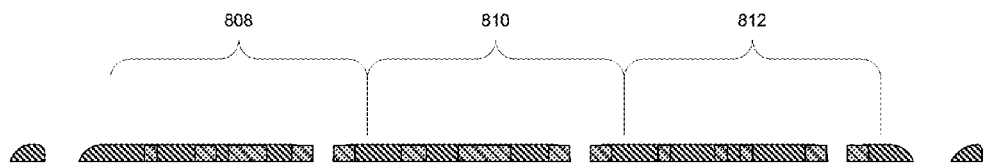

An example of the approach is shown in FIGS. 18A-18N, in which the sheet is presumed to be patterned during the layer fabrication process using etching. In FIG. 18A, a blank substrate 800 is shown. This has been coated with an attachment material 802 in FIG. 18B, and in FIG. 18C, an unpatterned structural material 804 has been deposited or laminated to the attachment material 802. In FIG. 18D, a photoresist 806 has been applied to the structural material 804 and in FIG. 18E, the resist has been patterned. In FIG. 18F, the structural material 804 has been etched using the resist as a mask to provide structural material with a desired pattern (e.g. including part features and alignment ring features 820). The locations of multiple die (e.g. Die 1 808, Die 2 810, Die 3 812, etc.) are indicated. The etching is preferably anisotropic to minimize undercutting. If the etch is more isotropic or if the thickness to be etched is large, then 2-sided etching may be used in some embodiments.

In FIG. 18G, the resist has been removed and in FIG. 18H, sacrificial material 816 has been blanket-deposited over the structural material 804. In FIG. 18I, a second photoresist 824 has been applied over the sacrificial material 816 and in FIG. 18J, the resist has been patterned. In some embodiments, in lieu of blanket-depositing the sacrificial material and then patterning it as shown, the material may be deposited in a pattern (e.g., by plating through a resist mask). In FIG. 18K, the sacrificial material has been etched using the resist as a pattern to define both the measurement probe apertures 818 (if they are to be used) and to remove sacrificial material from the centers of the rings 820. In FIG. 18L, the resist has been removed and the attachment material has been removed in the area of the measurement probe apertures. In FIG. 18M, the layer has been planarized using the measurement probes 822 to determine the layer thickness and parallelism. Then, in FIG. 18N, the attachment material has been removed. The sheet is now ready to be diced and stacked as before.

If wet chemical etching is used (e.g., FIG. 18F) then the isotropic etch can produce layer sidewalls that are non-planar and non-perpendicular to the layer top and bottom. In the field of photochemical machining, a common approach to reducing these effects is to perform two-sided, aligned etching. This approach can be integrated into the process flow above if alignment targets are provided in the sheet. The targets can be etched fully through the sheet from the top side (whereas the device features are only etched approximately halfway initially), allowing them to be used for alignment when the sheet is flipped over. The top side patterning may be performed without the need to first attach the sheet to a substrate if desired. After removing the photoresist from the top side, the sheet is flipped over and laminated it to the substrate, with the process continuing much as before (e.g., starting with FIG. 18D).

In some embodiments, bonding may occur by, or be supplemented by, laser drilling of holes in multiple layers after stacking (complete or partial) has occurred. This drilling may occur in all layers, may occur only in two layers at a time with alternate stacking and drilling. Simultaneous with the drilling, laser welding of the layers together may occur. In addition to, or in an alternative to laser welding, the holes may be filled in whole or in part in a single operation or in a multi-step operation with a deposited material (e.g. electrodeposited material, a sputtered material, and the like. In some variations the holes that are formed by laser ablation may be formed to have outward tapering walls such that the top of the openings are wider than the bottoms and such that electrodeposition to fill the holes doesn't inadvertently close off the top of the openings prior to completely filling the lower regions of the opening.

To reduce potential distortion or other damage to the die caused by a difference in coefficient of thermal expansion of structural and sacrificial material during bonding at an elevated temperature, it may be desirable that the die be small in size. In some embodiments, the sacrificial material may be perforated in a pattern (e.g., a series of vertical and horizontal cuts, a series of plus-sign-like shapes, or the like) that is not stiff such that in-plane deformation can easily occur when stresses occur. This patterning may occur before the layer is released from the substrate; it can be achieved in the same process that etches the dicing lanes. In effect, the sacrificial material, rather than being solid, becomes a "lace doily" that is less subject to dimensional changes which may adversely influencing bonding. Since a die with perforated sacrificial material is weaker and more prone to handling damage, in some embodiments a solid "frame" is included around the edges of the die, either comprised of sacrificial material or structural material. After stacking but before bonding (other than possibly tack bonding to keep the die from moving excessively), the frame may be cut away.

In some embodiments, at least one of the first or second portions may be formed from two or more layers wherein structural material extends from a primary layer or layers in the form of spring retention clips that can at least temporarily engage a complementary structure on the other of the first or second portion when primary mating surfaces are brought together. The retention clips may maintain the two or more portions in adjacent or proximate positions permanently or temporarily. Additional bonding methods or associated means may be used to provide more permanent, stronger, or a more uniform bonding or attachment. Such clips may provide for attachment by frictional means (e.g. pins forced from one or both portions into openings in the other portion or portions), elastic means (e.g. arms with detent slots or openings for engaging complementary structures located on the other portions, or miniature rivet-like elements that extend from one portion through another portion and then upon pressing flatten out to rivet the portions together at one or more locations.

FURTHER COMMENTS AND CONCLUSIONS

The embodiments of the present invention may be used to produce a variety of different parts including electrical spring contacts, micro-contacts, electrical connectors, micro-connectors, electric spring probes, micro-probes for acting as spring contacts during wafer level testing of integrated circuits, medical devices such as surgical components or assemblies, RF devices, switches, scanning mirrors, magnetic or electrical drive systems, pumps, turbines, fluid flow systems, inertial measurement devices such as accelerometers and/or gyroscopes, time delay mechanisms, and the like. Such parts may include multiple materials and multiple functional regions. For example, contacts, connectors, probes and other electrical devices may include contact tips for making contact (e.g. for scrubbing contact pads), they may include spring regions that provide a contact force, and they may include base regions and even adhesion materials that may be used in bonding of contacts or probes to functional substrates or housing elements.

Structural or sacrificial dielectric materials may be incorporated into embodiments of the present invention in a variety of different ways. Such materials may take the form of a third deposited material or higher deposited material on selected layers or may form one of the first two materials deposited on some layers. Additional teachings concerning the formation of structures on dielectric substrates and/or the formation of structures that incorporate dielectric materials into the formation process and possibility into the final structures as formed are set forth in a number of patent applications filed Dec. 31, 2003. The first of these is U.S. Patent Application No. 60/534,184 which is entitled "Electrochemical Fabrication Methods Incorporating Dielectric Materials and/or Using Dielectric Substrates". The second of these is U.S. Patent Application No. 60/533,932, which is entitled "Electrochemical Fabrication Methods Using Dielectric Substrates". The third of these is U.S. Patent Application No. 60/534,157, which is entitled "Electrochemical Fabrication Methods Incorporating Dielectric Materials". The fourth of these filings is U.S. Patent Application No. 60/533,891, which is entitled "Methods for Electrochemically Fabricating Structures Incorporating Dielectric Sheets and/or Seed layers That Are Partially Removed Via Planarization". A fifth is U.S. Patent Application No. 60/533,895, which is entitled "Electrochemical Fabrication Method for Producing Multi-layer Three-Dimensional Structures on a Porous Dielectric". Additional patent filings that provide teachings concerning incorporation of dielectrics into the EFAB process include U.S. patent application Ser. No. 11/139,262, filed May 26, 2005, now U.S. Pat. No. 7,501,328, by Lockard, et al., and which is entitled "Methods for Electrochemically Fabricating Structures Using Adhered Masks, Incorporating Dielectric Sheets, and/or Seed Layers that are Partially Removed Via Planarization"; and U.S. patent application Ser. No. 11/029,216, filed Jan. 3, 2005 by Cohen, et al., now abandoned, and which is entitled "Electrochemical Fabrication Methods Incorporating Dielectric Materials and/or Using Dielectric Substrates". These patent filings are each hereby incorporated herein by reference as if set forth in full herein.

Some embodiments may employ diffusion bonding or the like to enhance adhesion between successive layers of material. Various teachings concerning the use of diffusion bonding in electrochemical fabrication processes are set forth in U.S. patent application Ser. No. 10/841,384 which was filed May 7, 2004 by Cohen et al., now abandoned, which is entitled "Method of Electrochemically Fabricating Multilayer Structures Having Improved Interlayer Adhesion" and which is hereby incorporated herein by reference as if set forth in full. This application is hereby incorporated herein by reference as if set forth in full.

In some embodiments, it is possible to form structures on a layer-by-layer basis but to deviate from a strict planar layer on planar layer build up process in favor of a process that interlaces material between the layers. Such alternative build processes are disclosed in U.S. application Ser. No. 10/434,519, filed on May 7, 2003, now U.S. Pat. No. 7,252,861, entitled Methods of and Apparatus for Electrochemically Fabricating Structures Via Interlaced Layers or Via Selective Etching and Filling of Voids. The techniques disclosed in this referenced application may be combined with the techniques and alternatives set forth explicitly herein to derive additional alternative embodiments. In particular, the structural features are still defined on a planar-layer-by-planar-layer basis but material associated with some layers are formed along with material for other layers such that interlacing of deposited material occurs. Such interlacing may lead to reduced structural distortion during formation or improved interlayer adhesion. This patent is incorporated herein by reference. The formation of interlacing elements may occur along with the formation of individual layers or interlacing opening may be formed along with the formation of individual layers and after stacking additional electrodeposition or other deposition may occur to fill in the holes to cause interlacing and improved adhesion. Planarization may occur after such interlacing. Interlacing may occur after stacking only two layers, less than all layers and/or after all layers have been stacked.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| U.S. patent application Ser. No., Filing Date U.S. App Pub No., Pub Date U.S. Pat. No., Pub Date | Inventor, Title |
|---|---|
| 09/493,496 - Jan. 28, 2000 U.S. Pat. No. 6,790,377 - Sep. 14, 2004 | Cohen, "Method For Electrochemical Fabrication" |
| 10/677,556 - Oct. 1, 2003 2004-0134772 - Jul. 15, 2004 | Cohen, "Monolithic Structures Including Alignment and/or Retention Fixtures for Accepting Components" |
| 10/830,262 - Apr. 21, 2004 2004-0251142A - Dec. 16, 2004 U.S. Pat. No. 7,198,704 - Apr. 3, 2007 | Cohen, "Methods of Reducing Interlayer Discontinuities in Electrochemically Fabricated Three-Dimensional Structures" |
| 10/271,574 - Oct. 15, 2002 2003-0127336A - Jul. 10, 2003 U.S. Pat. No. 7,288,178 - Oct. 30, 2007 | Cohen, "Methods of and Apparatus for Making High Aspect Ratio Microelectromechanical Structures" |
| 10/697,597 - Dec. 20, 2002 2004-0146650A - Jul. 29, 2004 | Lockard, "EFAB Methods and Apparatus Including Spray Metal or Powder Coating Processes" |
| 10/677,498 - Oct. 1, 2003 2004-0134788 - Jul. 15, 2004 U.S. Pat. No. 7,235,166 - Jun. 26, 2007 | Cohen, "Multi-cell Masks and Methods and Apparatus for Using Such Masks To Form Three-Dimensional Structures" |
| 10/724,513 - Nov. 26, 2003 2004-0147124 - Jul. 29, 2004 U.S. Pat. No. 7,368,044 - May 6, 2008 | Cohen, "Non-Conformable Masks and Methods and Apparatus for Forming Three-Dimensional Structures" |
| 10/607,931- Jun. 27, 2003 2004-0140862 - Jul. 22, 2004 U.S. Pat. No. 7,239,219 - Jul. 3, 2007 | Brown, "Miniature RF and Microwave Components and Methods for Fabricating Such Components" |
| 10/841,100 - May 7, 2004 2005-0032362 - Feb. 10, 2005 U.S. Pat. No. 7,109,118 - Sep. 19, 2006 | Cohen, "Electrochemical Fabrication Methods Including Use of Surface Treatments to Reduce Overplating and/or Planarization During Formation of Multi-layer Three-Dimensional Structures" |
| 10/387,958 - Mar. 13, 2003 2003-022168A - Dec. 4, 2003 | Cohen, "Electrochemical Fabrication Method and Application for Producing Three-Dimensional Structures Having Improved Surface Finish" |
| 10/434,494 - May 7, 2003 2004-0000489A - Jan. 1, 2004 | Zhang, "Methods and Apparatus for Monitoring Deposition Quality During Conformable Contact Mask Plating Operations" |
| 10/434,289 - May 7, 2003 20040065555A - Apr. 8, 2004 | Zhang, "Conformable Contact Masking Methods and Apparatus Utilizing In Situ Cathodic Activation of a Substrate" |
| 10/434,294 - May 7, 2003 2004-0065550A - Apr. 8, 2004 | Zhang, "Electrochemical Fabrication Methods With Enhanced Post Deposition Processing" |
| 10/434,295 - May 7, 2003 2004-0004001A - Jan. 8, 2004 | Cohen, "Method of and Apparatus for Forming Three-Dimensional Structures Integral With Semiconductor Based Circuitry" |
| 10/434,315 - May 7, 2003 2003-0234179A - Dec. 25, 2003 U.S. Pat. No. 7,229,542 - Jun. 12, 2007 | Bang, "Methods of and Apparatus for Molding Structures Using Sacrificial Metal Patterns" |
| 10/434,103 - May 7, 2004 2004-0020782A - Feb. 5, 2004 U.S. Pat. No. 7,160,429 - Jan. 9, 2007 | Cohen, "Electrochemically Fabricated Hermetically Sealed Microstructures and Methods of and Apparatus for Producing Such Structures" |
| 10/841,006 - May 7, 2004 2005-0067292 - May 31, 2005 | Thompson, "Electrochemically Fabricated Structures Having Dielectric or Active Bases and Methods of and Apparatus for Producing Such Structures" |
| 10/434,519 - May 7, 2003 2004-0007470A - Jan. 15, 2004 U.S. Pat. No. 7,252,861 - Aug. 7, 2007 | Smalley, "Methods of and Apparatus for Electrochemically Fabricating Structures Via Interlaced Layers or Via Selective Etching and Filling of Voids" |
| 10/724,515 - Nov. 26, 2003 2004-0182716 - Sep. 23, 2004 U.S. Pat. No. 7,291,254 - Nov. 6, 2007 | Cohen, "Method for Electrochemically Forming Structures Including Non-Parallel Mating of Contact Masks and Substrates" |
| 10/841,347 - May 7, 2004 2005-0072681 - Apr. 7, 2005 | Cohen, "Multi-step Release Method for Electrochemically Fabricated Structures" |
| 60/533,947 - Dec. 31, 2003 | Kumar, "Probe Arrays and Method for Making" |
| 60/534,183 - Dec. 31, 2003 | Cohen, "Method and Apparatus for Maintaining Parallelism of Layers and/or Achieving Desired Thicknesses of Layers During the Electrochemical Fabrication of Structures" |
| 11/733,195 - Apr. 9, 2007 2008-0050524 - Feb. 28, 2008 | Kumar, "Methods of Forming Three-Dimensional Structures Having Reduced Stress and/or Curvature" |
| 11/506,586 - Aug. 8, 2006 2007-0039828 - Feb. 22, 2007 U.S. Pat. No. 7,611,616 - Nov. 3, 2009 | Cohen, "Mesoscale and Microscale Device Fabrication Methods Using Split Structures and Alignment Elements" |
| 10/949,744 - Sep. 24, 2004 2005-0126916 - Jun. 16, 2005 U.S. Pat. No. 7,498,714 - Mar. 3, 2009 | Lockard, "Three-Dimensional Structures Having Feature Sizes Smaller Than a Minimum Feature Size and Methods for Fabricating" |

Though various portions of this specification have been provided with headers, it is not intended that the headers be used to limit the application of teachings found in one portion of the specification from applying to other portions of the specification. For example, it should be understood that alternatives acknowledged in association with one embodiment, are intended to apply to all embodiments to the extent that the features of the different embodiments make such application functional and do not otherwise contradict or remove all benefits of the adopted embodiment. Various other embodiments of the present invention exist. Some of these embodiments may be based on a combination of the teachings herein with various teachings incorporated herein by reference.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A method for forming at least a portion of a multi-layer three-dimensional part having a desired configuration, comprising:
   a. forming at least first and second portions of a structure where each is formed from at least one multi-material layer comprising at least one structural material and at least one sacrificial material, where the first portion has a first surface and the second portion has a second surface where the first and second surfaces are separated from one another during formation of the layers but which are to be located in contact, or in proximity, to one another in the desired configuration;
   b. separating the at least first and second portions of the structure from any sacrificial material that would hinder the bringing of the at least first and second portions into contact, or into proximity, or which would be effectively trapped if in place when the at least first and second portions are brought together; and
   c. moving at least one of the at least first and second portions relative to the other to bring the at least first and second surfaces into contact or into proximity to a multi-portion stack of layers of the multi-layer three-dimensional part,
   wherein the forming comprises depositing at least one of the at least one structural material or the at least one sacrificial material selectively onto a substrate or previously deposited material via one or more openings in a masking material that is adhered to the substrate or previously deposited material, and
   wherein after bringing at least two of the least first and second portions into contact or into proximity, bonding at least the first and second portions together by using an adhesion material on at least one of the first and second surfaces and then pressing and heating the surfaces to cause bonding, and
   forming holes in one or more portions and depositing material into the holes to cause bonding of the portions.

2. The method of claim 1 wherein the at least first and second portions comprise at least first, second, and third portions.

3. The method of claim 2 wherein the first and second portions are stacked and bonded prior to adding the third portion to the stack and bonding.

4. The method of claim 2 wherein the first, second, and third portions are stacked prior to bonding any of them and thereafter bonding of the first to the second and the second to the third occurs.

5. The method of claim 1 wherein the first and second portions are formed on the same substrate in the same fabrication process.

6. The method of claim 1 wherein the first and second portions are formed on different substrates.

7. The method of claim 1 wherein the at least one structural material or the at least one sacrificial material forming a multi-material layer of the first or second portion is formed by electrodeposition.

8. The method of claim 7 wherein the electrodeposition comprises a selective electrodeposition into at least one opening in a dielectric masking material.

9. The method of claim 1 wherein the at least one structural material on the first or second portion is formed from a sheet material.

10. The method of claim 9 wherein the at least one structural material that is formed from a sheet of material is patterned by laser cutting.

11. The method of claim 1 wherein formation of a multi-material layer results in formation of at least parts of multiple portions of the three-dimensional structure.

12. The method of claim 1 wherein alignment of stacked layers comprises use of at least one alignment pin.

13. The method of claim 12 wherein the at least one alignment pin comprises a plurality of alignment pins.

14. The method of claim 12 wherein an insertion location for the at least one alignment pin includes an opening in at least one structural region of at least two portions of a part being formed.

15. The method of claim 14 wherein the insertion is temporary and the pin is removed prior to putting the part into service.

16. The method of claim 14 wherein the insertion is permanent and the pin remains with the part as the part is put into service.

17. The method of claim 1 wherein alignment of stacked layers comprises use of at least one edge surface of a die or die group.

18. The method of claim 17 wherein the edge surface comprises at least two edge surfaces.

19. A method for forming at least a portion of a three-dimensional structure having a desired configuration, comprising:
   a. forming at least first and second portions of a structure from a plurality of adhered layers of at least one structural material where the first portion has a first surface and the second portion has a second surface where the first and second surfaces are separated from one another during formation of the layers but which are to be located in contact or in proximity to one another in the desired configuration; and
   b. moving at least one of the first and second portions relative to the other to bring the first and second surfaces into contact or into proximity,
      i. wherein the forming comprises depositing at least one material selectively onto a substrate or previously deposited material via one or more openings in a masking material that is adhered to the substrate or previously deposited material, and
      ii. wherein the forming comprises forming one or more alignment structures which aid in locating the first and second surfaces in proximity or in contact and/or which aid in guiding the first and second surfaces in proximity or in contact, wherein after bringing the at first and second surfaces into contact or into proximity, bonding at least the first and second portions together by using an adhesion material on at least one of the first and second surfaces and then pressing and heating the surfaces to cause bonding, and forming holes in one or more portions and depositing material into the holes to cause bonding of the portions.

20. A method for forming at least a portion of a three-dimensional structure having a desired configuration, comprising:

a. forming at least first, second, and third portions of a structure from a plurality of adhered layers of at least one structural material where the first portion has a first surface and the second portion has a second surface and the third portion has a third surface, where the first and second surfaces are separated from one another during formation of the layers but which are to be located in contact or in proximity to one another in the desired configuration, and wherein the third surface is separated from the first and second portions during formation but is to be located in contact or in proximity to a surface of one of the first or second portions in the desired configuration; and b. moving at least one of the first and second portions relative to the other to bring the first and second surfaces into contact or into proximity, c. moving at least one of the third or contacting or proximate first and second portions relative to one another to bring the first, second, and third and portions into contact or into proximity, wherein after bringing the at first and second surfaces into contact or into proximity, bonding at least the first and second portions together by using an adhesion material on at least one of the first and second surfaces and then pressing and heating the surfaces to cause bonding, and forming holes in one or more portions and depositing material into the holes to cause bonding of the portions.

\* \* \* \* \*